(12) United States Patent
Ohsumi

(10) Patent No.: US 8,211,750 B2
(45) Date of Patent: Jul. 3, 2012

(54) SEMICONDUCTOR DEVICE COMPRISING LIGHT-EMITTING ELEMENT AND LIGHT-RECEIVING ELEMENT, AND MANUFACTURING METHOD THEREFOR

(75) Inventor: Takashi Ohsumi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 643 days.

(21) Appl. No.: 12/261,399

(22) Filed: Oct. 30, 2008

(65) Prior Publication Data

US 2009/0053856 A1    Feb. 26, 2009

Related U.S. Application Data

(62) Division of application No. 11/229,765, filed on Sep. 20, 2005.

(30) Foreign Application Priority Data

Sep. 30, 2004 (JP) ................................ 2004-288904
Aug. 12, 2005 (JP) ................................ 2005-234532

(51) Int. Cl.
*H01L 21/50* (2006.01)

(52) U.S. Cl. ......... 438/113; 438/110; 438/107; 438/33; 438/68; 438/66; 257/433; 257/E21.499

(58) Field of Classification Search .............. 438/113, 438/110, 107, 33, 68, 66; 257/433, E21.499
See application file for complete search history.

(56) References Cited

U.S. PATENT DOCUMENTS

| 6,825,967 | B1 | 11/2004 | Chong et al. | |
|---|---|---|---|---|
| 6,906,427 | B2 | 6/2005 | Tanaka et al. | |
| 2002/0027296 | A1 | 3/2002 | Badehi | |
| 2004/0056340 | A1* | 3/2004 | Jobetto | 257/678 |
| 2005/0001331 | A1* | 1/2005 | Kojima et al. | 257/778 |

FOREIGN PATENT DOCUMENTS

| JP | 2002329850 | 11/2002 |
|---|---|---|
| JP | 2004111792 | 4/2004 |

* cited by examiner

*Primary Examiner* — Junghwa M Im
(74) *Attorney, Agent, or Firm* — Volentine & Whitt, PLLC

(57) ABSTRACT

A semiconductor device includes a substrate for transmitting light, a wiring layer provided on the substrate, a semiconductor chip formed on the wiring layer, a columnar electrode, a sealant, and an external connection terminal electrically connected to the semiconductor chip via the wiring layer and protruding electrode. The device includes a cut surface formed by dicing and constituted by only the substrate and the sealant. Since the cut surface has a single-layer structure as a result of forming the sealant in a single step, moisture cannot infiltrate through the sealant, hence a device resistant to corrosion and operational defects is provided.

2 Claims, 19 Drawing Sheets

SEMICONDUCTOR DEVICE COMPRISING LIGHT-EMITTING ELEMENT AND LIGHT-RECEIVING ELEMENT, AND MANUFACTURING METHOD THEREFOR

CROSS REFERENCE TO RELATED APPLICATIONS

This is a divisional application of application Ser. No. 11/229,765, filed Sep. 20, 2005, which is hereby incorporated by reference in its entirety for all purposes.

BACKGROUND OF THE INVENTION

1. Field of the Invention

The present invention relates principally to a semiconductor device and a packaging method thereof, and more particularly to a semiconductor device comprising a light-receiving element which operates in response to light and a light-emitting element which emits light, for example a semiconductor device including an image sensor such as a CCD or CMOS, a light-emitting diode, a photoelectric conversion element, and so on, and a packaging method thereof.

2. Description of the Related Art

Conventionally, when packaging a semiconductor device comprising a light-receiving element and light-emitting element manufactured in wafer form, the wafer on which the light-receiving elements and/or light-emitting elements are formed is cut into individual semiconductor chips 4410 by means of dicing, as shown in FIG. 44. The individual semiconductor chip 4410 is then mounted on a ceramic header 4420, whereupon an electrode 4430 of the semiconductor chip mounted on the ceramic header 4420 is electrically connected to a conductor portion of the ceramic header 4420 by wire bonding 4440. A lid 4450 which transmits light is then adhered to the ceramic header 4420. This is a typical semiconductor device packaging method.

Japanese Patent Application Publication Kokai No. 2002-329850 (hereinafter, referred to as "patent document-1") and Japanese Patent Application Publication Kokai No. 2004-111792 (hereinafter, referred to as "patent document-2") may be cited as examples of packaging methods which do not use a ceramic header.

The patent document-1 discloses a semiconductor device constituted by a semiconductor chip whose side face and rear face are coated with a resin, and whose top face comprises an electrode pad that is electrically connected to a light-receiving element, and a glass substrate having a first face which contacts the top face of the semiconductor chip. Thus an electrode pattern formed over the resin-coated side face and rear face of the semiconductor device, a conductive pattern provided on the first face of the glass substrate, and the light-receiving element are electrically connected. In a manufacturing method of the patent document-1, a wafer comprising the light-receiving element and a translucent substrate comprising a lens are formed separately, and individual ICs are made by cutting after the wafer and translucent substrate are adhered together.

The patent document-2 discloses a semiconductor device comprising a semiconductor chip in which top face, side face, and bottom face are coated with a transparent resin, and the top face is formed with a photoresponsive element, and a transparent substrate formed on the top face side of the semiconductor chip at a remove therefrom. Thus wiring coated with a plurality of resin layers, which extends around the periphery of the semiconductor chip and is connected electrically to the photoresponsive element, is electrically connected to connecting means for connecting the tip end of the wiring to an external electrode.

With packaging methods using a ceramic header, the semiconductor chip is mounted on a ceramic header having a greater exterior dimension than that of the semiconductor chip, thereby increasing the exterior dimension of the packaged semiconductor device. Moreover, space must be provided above the semiconductor chip for the wire bonding and lid, thereby increasing the thickness of the packaged semiconductor device, and hence it is difficult to achieve a reduction in size. Packaging methods using a ceramic header are also problematic in that costs are higher than in packaging methods using resin.

Further, in the patent document-1, the electrode pattern formed on the side face is exposed, and hence a short circuit is more likely to occur between electrode patterns when the electrode patterns come into contact. Moreover, during handling of the individual packages, the electrode pattern may become disconnected when the electrode pattern contacts a semiconductor holder used for lifting the semiconductor device. Also with the manufacturing method of the patent document-1 the wafer comprising the light-receiving element and the translucent substrate comprising the lens are formed separately and then adhered together, leading to alignment errors which result in a decrease in productivity.

In the patent document-2, the side face of the semiconductor device is constituted by a sealant using a plurality of resin layers, and hence cracks or the like may appear at the boundary line parts of these resin layers during a heating process such as reflow processing, possibly causing the semiconductor device to break. Further problems such as corrosion of the wiring layers formed in the semiconductor device due to moisture infiltrating through the boundary lines of the resin layers, and abnormalities in the characteristics of the semiconductor element due to the incoming moisture, may lead to a breakdown in the functions of the semiconductor element, resulting in a reduction in the long-term reliability of the device.

SUMMARY OF THE INVENTION

The present invention has been made in consideration of the problems described above. To solve these problems, a semiconductor device and a manufacturing method thereof according to the present invention have the following features.

A semiconductor device according to the present invention includes a substrate having a first face and a second face opposing the first face, for transmitting light through the first face and the second face; a wiring layer provided on the first face of the substrate, having a first region and a second region adjacent to the first region; a semiconductor chip having a main face comprising a third region and a fourth region surrounding the third region, which is formed on the first region of the wiring layer for electrically connecting the wiring layer to the fourth region; a columnar electrode taking a columnar form and having a third face and a fourth face opposing the third face, the third face being provided on the second region of the wiring layer such that the columnar electrode is electrically connected to the wiring layer; a sealant constituted by a single resin, which covers the first face of the substrate such that the fourth face of the columnar electrode and the third region of the semiconductor chip are exposed; a cut surface formed by dicing and constituted by only two layers comprising the substrate and the sealant; and an external connection terminal provided on the fourth face of the columnar electrode so as to be electrically connected to the columnar electrode.

Further, a manufacturing method for a semiconductor device according to the present invention includes the steps of preparing a substrate having a first face and a second face opposing the first face, for transmitting light through the first face and second face; providing a wiring layer having a first region and a second region adjacent to the first region on the first face of the substrate; providing a bump electrode on the first region of the wiring layer; providing a semiconductor chip having a third face such that the third face is connected to the bump electrode; providing a columnar electrode having a fourth face and a fifth face opposing the fourth face such that the fourth face contacts the second region of the wiring layer; providing a first sealant covering the first face of the substrate such that the fifth face of the columnar electrode is exposed; providing an external connection terminal on the fifth face of the columnar electrode; and dividing the substrate and the first sealant into individual semiconductor devices through dicing.

According to the present invention, there is no need to mount the semiconductor device on a ceramic header, as is performed conventionally, and hence the final, packaged form of the semiconductor device can be reduced in size.

Also according to the present invention, the side portion of the columnar electrode is coated in resin, and hence short circuiting of the wiring patterns due to external shocks and the like can be prevented. Furthermore, disconnection of the wiring patterns caused when the device contacts the wiring patterns during handling of the semiconductor device package can also be prevented.

Also according to the present invention, the cut surface formed by dicing is constituted by only two layers, i.e. a single sealant and a transparent substrate, having no boundary lines between resin layers, and hence problems such as breakage of the resin during a heating process such as reflow processing can be reduced. Furthermore, moisture or the like is prevented from infiltrating through the boundary lines of the resin layers, and hence the long-term reliability of the wiring and the semiconductor chip can be improved.

According to the manufacturing method of the present invention, the manufacture of a semiconductor device comprising a light-receiving element or a light-emitting element can be realized at the wafer level, and hence the size and cost of the manufactured device can be reduced. Moreover, a manufacturing method in which layers are formed in succession on the transparent substrate is employed, and hence there is no need to adhere the transparent substrate and semiconductor wafer together. As a result, alignment errors are eliminated, enabling an improvement in productivity.

DETAILED DESCRIPTION OF THE INVENTION

Figure 1:
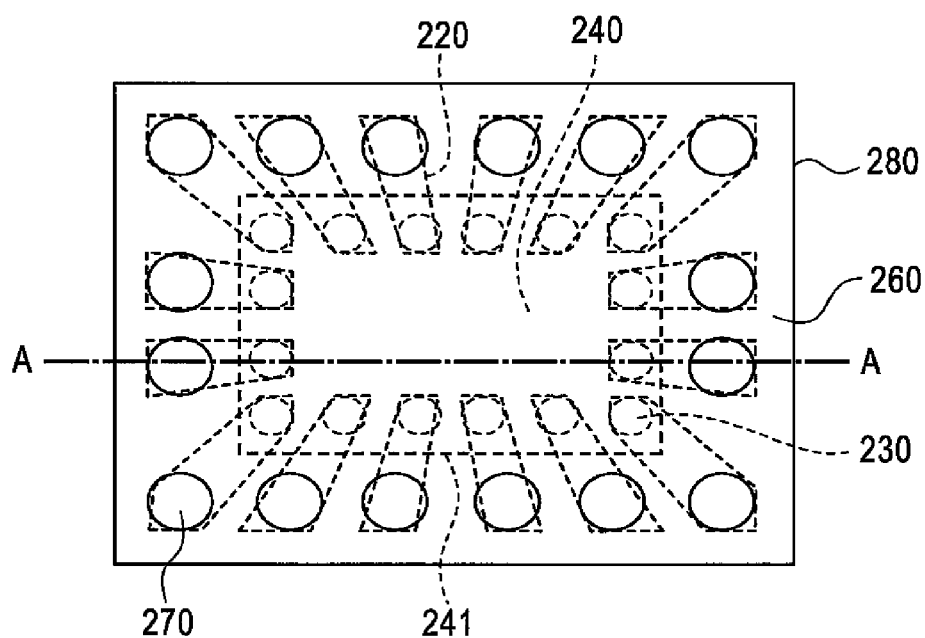
FIG. 1 is a plan view of a semiconductor device according to a first embodiment of the present invention.

Embodiments of the present invention will be described below with reference to the drawings. Note that in the drawings, the form, magnitude, and positional relationships of each constitutional component are merely shown in outline to the extent that the invention can be understood, and no particular limitations are placed on the invention thereby. Furthermore, in the following description, specific materials, conditions, numerical value conditions, and so on are used, but these are merely preferred examples, and hence the present invention is not limited thereby. Moreover, the semiconductor device and manufacturing processes of the present invention may be implemented using a well-known material such as a silicon substrate and by well-known means such as etching. Accordingly, detailed description of these materials and means have been omitted occasionally.

[Structure]

The structure of a semiconductor device according to a first embodiment of the present invention will now be described referring to FIGS. 1 and 2.

Figure 2:
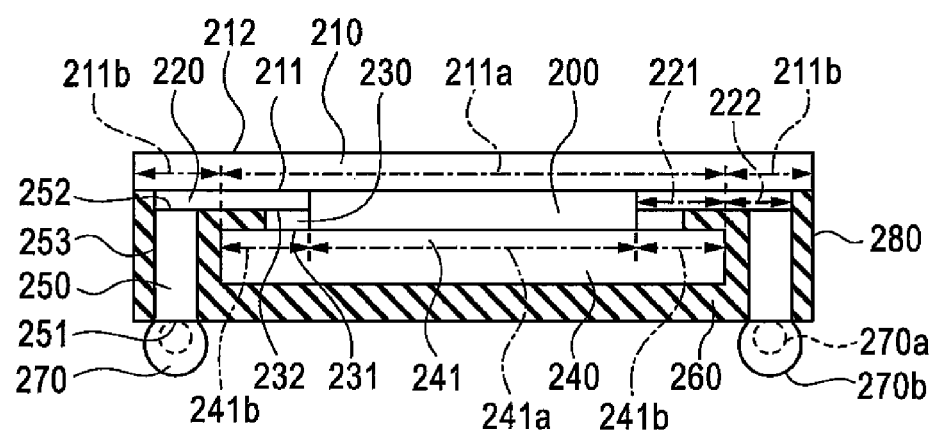
FIG. 2 is a sectional view along A-A in FIG. 1.

FIG. 1 is a plan view of the semiconductor device according to the first embodiment of the present invention, and FIG. 2 is a sectional view along A-A in FIG. 1.

As shown in FIGS. 1 and 2, the semiconductor device according to the first embodiment of the present invention includes a transparent substrate 210, a wiring layer 220, a bump electrode 230, a semiconductor chip 240, a columnar or pillar-form electrode 250, a sealant 260, an external connection terminal 270, and a cut surface 280.

The transparent substrate 210 comprises a rectangular first face 211 having a central region 211a and a peripheral region 211b surrounding the central region 211a, and a second face 212 opposing the first face 211. The transparent substrate 210 transmits light through the first face 211 and the second face 212. Examples of the material of the transparent substrate 210 include soda glass, silica glass, sapphire, and other substrates that transmit light. The semiconductor chip 240 is disposed on the central region 211a of the first face 211 of the transparent substrate 210 via the bump electrode 230, which will be described below.

The wiring layer 220 is formed on the first face 211 of the transparent substrate 210, and extends over the central region 211a and the peripheral region 211b of the first face 211. The wiring layer 220 is formed on the first face 211, and comprises a first region 221 formed on the central region 211a of the first face, and a second region 222 formed on the peripheral region 211b of the first face. The wiring layer 220 is formed from a material which is capable of connecting the bump electrode 230 and columnar electrode 250 electrically. Examples of the material of the wiring layer 220 include a metal conductor such as titanium (Ti), copper (Cu), tungsten (W), and gold (Au), an alloy having any one of titanium (Ti), copper (Cu), tungsten (W), and gold (Au) as its main component, or a transparent conductor material such as ITO (indium tin oxide).

The semiconductor chip 240 comprises a rectangular third face 241, and the third face 241 comprises a third region 241a formed with either a light-receiving element which operates in response to light, such as a photoelectric conversion element, or an image sensor such as a CCD and a CMOS, or a light-emitting element such as a light-emitting diode and a fourth region 241b surrounding the third region 241a and formed with the bump electrode 230 (described below). Here, the fourth region 241b formed with the bump electrode 230 includes the outer edge portion of the third face 241. Hence the light-receiving element and light-emitting element of the third region 241a may be formed so as to extend to the fourth region 241b. The semiconductor chip 240 is disposed on the central region 211a of the first face 211 of the transparent substrate 210 via the bump electrode 230.

The bump electrode 230 is formed on the semiconductor chip 240. The bump electrode 230 is formed in the fourth region 241b of the third face of the semiconductor chip 240, and is a columnar conductor having a top face 231 and a bottom face 232 opposing the top face 231. The semiconductor chip 240 and bump electrode 230 are electrically connected. Here, the phrase "the semiconductor chip 240 and bump electrode 230 are electrically connected" indicates that a semiconductor element disposed on the third face 241 of the semiconductor chip 240 and the bump electrode 230 are electrically connected. Examples of the conductive material of the bump electrode 230 include a metallic conductor such as titanium (Ti), copper (Cu), tungsten (W), and gold (Au), an alloy having any one of titanium (Ti), copper (Cu), tungsten (W), and gold (Au) as its main component, or a transparent conductor material such as ITO.

The columnar electrode 250 is formed on the second region 222 of the wiring layer 220, and is constituted by a columnar conductor having a top face 251 and a bottom face 252 opposing the top face 251. Here, the columnar electrode 250 is formed such that the bottom face 252 faces the second region 222 of the wiring layer 220. A conductive material is used as the material of the columnar electrode 250. Examples of the conductive material include a metallic conductor such as copper (Cu) or gold (Au).

The sealant 260 is constituted by a single resin, and covers the transparent substrate 210, the side face of the columnar electrode 250, and the semiconductor chip 240. Here, a three-dimensional space surrounded by the first face 211 of the transparent substrate 210, the bump electrode 230, and the third face 241 of the semiconductor chip 240 is set as a region 200. At this time, the sealant 260 is not formed on the region 200. In other words, measures should be taken to ensure that light passing through the transparent substrate 210 is not prevented from reaching the light-receiving element on the semiconductor chip 240. Examples of the material of the sealant 260 include resins used for general plastic molding, such as epoxy resin.

The external connection terminal 270 is formed from a conductive material shaped into a ball form or protrusion form, and is connected to the top face 251 of the columnar electrode 250. Examples of the conductive material include fused metals such as lead (Pb)-tin (Sn), gold (Au)-tin (Sn), and tin (Sn)-silver (Ag)-copper (Cu). When a ball form is employed, it is possible to use either a ball formed from these fused metals alone, or a ball constituted by a core formed from a non-fused metal or plastic material and a connection layer formed from a fused metal covering the periphery of the core. In FIG. 2, an example is illustrated in which a ball constituted by a core 270a formed from such a non-fused metal or plastic material and a connection layer 270b formed from a fused metal covering the periphery of the core 270a is used as the external connection terminal 270.

The cut surface 280 is a surface formed by dicing, and serves as a constitutional part of the semiconductor device. The cut surface 280 is constituted by only two layers, i.e. the single type sealant 260 and the transparent substrate 210. Here, the phrase "constituted by only two layers" in the claims of the present application indicates that the materials constituting the cut surface are made up of these two layers. However, even when an adhesive member or the like for adhering the two layers together exists between the single type sealant 260 and the transparent substrate 210, for example, the existence of this adhesive member is included in the expression "constituted by only two layers". In other words, even when a layer exists between the sealant 260 and transparent substrate 210 constituting the cut surface 280, as long as this layer cannot function alone as a sealant and is sufficiently thinner than the sealant 260, the existence of the layer is included in the expression "constituted by only two layers".

According to the structure of the first embodiment of the present invention, the semiconductor device comprises a light-emitting element and the light-receiving element, but does not use a ceramic header, and hence a reduction in the size of the final package structure can be realized. Further, the sealant is formed around the columnar electrode, and hence the sealant protects against external shocks, thereby reducing the likelihood of a short circuit or disconnection of the wiring patterns, as occurs in the semiconductor device of the patent document-1. Further, by forming the external connection terminal in such a manner that the external connection terminal is melted, coated onto an external electrode and the columnar electrode, and then hardened so as to be connected to the external electrode and columnar electrode, the reliability of the connection between the external electrode and the columnar electrode can be improved. Here, a ball formed from a resin or metal core material and coated with a fused metal is used as the external connection terminal, and hence height variation during packaging can also be avoided. When an external connection terminal having a core material is used, the fused metal covering the periphery of the core material is melted and then coated onto the external electrode and columnar electrode, whereas the core material is sandwiched between the external electrode and columnar electrode without being melted. Hence when the semiconductor device is mounted onto an external substrate, the gap between the external substrate and the semiconductor device can be made equal to the height of the core material, thereby preventing height variation during packaging. As a result, the semiconductor device can be connected parallel to the external substrate, thus reducing errors relating to light transmission during packaging. Moreover, the cut surface is constituted by two layers, i.e. the single sealant and the transparent substrate, and hence the resin layer boundary described in the patent document-2 do not exist. As a result, defects such as breakage of the resin parts can be avoided even during a heating process such as reflow processing, and moisture or the like can be prevented from infiltrating between the resin layers, leading to an improvement in long-term reliability with no corrosion or characteristic abnormalities in the wiring and semiconductor chip,

[Manufacturing Method]

A manufacturing method of the semiconductor device according to the first embodiment of the present invention will be described below while referring to FIGS. 3 to 10.

Figure 3:
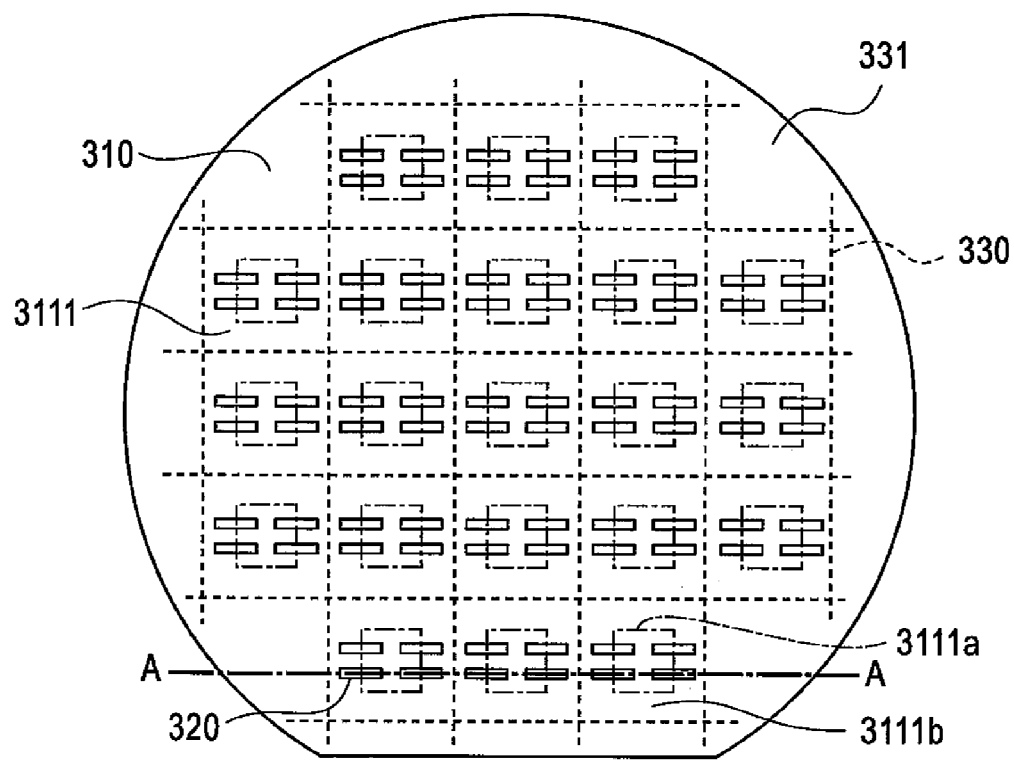
FIG. 3 is a view illustrating a manufacturing method of the semiconductor device according to the first embodiment of the present invention.
Figure 4:
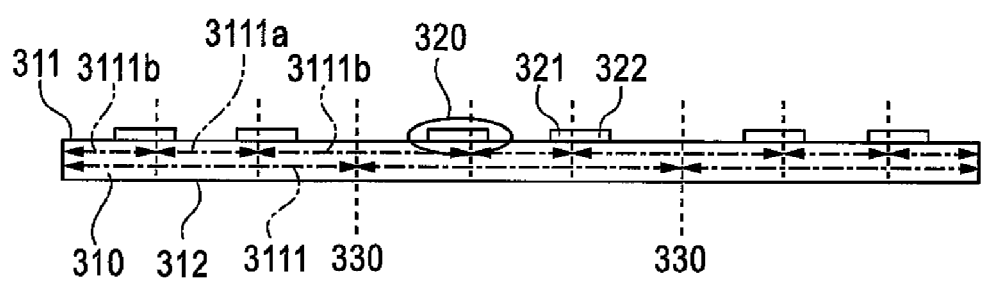
FIG. 4 is a view illustrating the manufacturing method of the semiconductor device according to the first embodiment of the present invention.

As shown in FIGS. 3 and 4, a wiring layer 320 is formed on a transparent substrate 310. FIG. 3 is a plan view showing a part of the manufacturing process of the semiconductor device, and FIGS. 4 to 10 are sectional views along A-A in FIG. 3. First, the wafer-form transparent substrate 310, having a first face 311 (top face) and a second face 312 (bottom face) opposing the first face 311, for transmitting light through the first face 311 and the second face 312, is prepared. The first face 311 of the transparent substrate 310 comprises a plurality of regions 3111 divided into matrix form by scribe lines 330. Each region 3111 comprises a central region 3111a and a peripheral region 3111b surrounding the central region 3111a. The wiring layer 320 is formed by a process (photolithographic process) of forming a conductive material over the entire first face 311 of the transparent substrate 310, painting resist thereon, exposing the wiring layer pattern portion to light, removing the unexposed part, and etching the conductive material. Note that instead of this photolithographic process, the wiring layer 320 may be formed using a process of rendering, printing, or otherwise processing a conductive material containing metal particles, a process of forming a seed layer on the entire first face 311 of the transparent substrate 310 through sputtering, forming the seed layer into a pattern of the wiring layer 320 through a photolithographic process, and then forming the wiring layer 320 comparatively thickly through plating, or another process.

Figure 5:
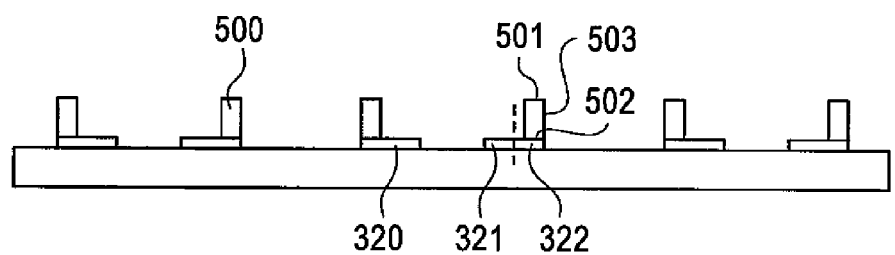
FIG. 5 is a view illustrating the manufacturing method of the semiconductor device according to the first embodiment of the present invention.

Next, as shown in FIG. 5, a columnar electrode 500 is formed on a second region 322 of the wiring layer 320. The columnar electrode 500 is a columnar conductor comprising a top face 501, a bottom face 502 opposing the top face 501, and a side face 503 contacting the top face 501 and the bottom face 502. Here, the bottom face 502 of the columnar electrode 500 faces the wiring layer 320. The columnar electrode 500 is formed by a similar process to the process for forming the wiring layer 320, i.e. forming a seed layer through sputtering, and then forming a seed layer of the columnar electrode 500 by means of a photolithographic process. Note that the columnar electrode 500 may also be formed by a process of growing the seed layer of the columnar electrode 500 through plating, a process of forming a resist layer, providing an opening in the resist in the second region 322 of the wiring layer 320, and then filling the opening with a conductive material, or another process. When the material used for the wiring layer 320 and the material used for the columnar electrode 500 are identical, the columnar electrode 500 is preferably formed directly on the wiring layer 320. When the material used for the wiring layer 320 and the material used for the columnar electrode 500 are different and the manufacturer wishes to suppress metal diffusion and so on, it is preferable to form an intermediate metal layer (not shown) serving as a barrier film between the wiring layer 320 and columnar electrode 500.

Figure 6:
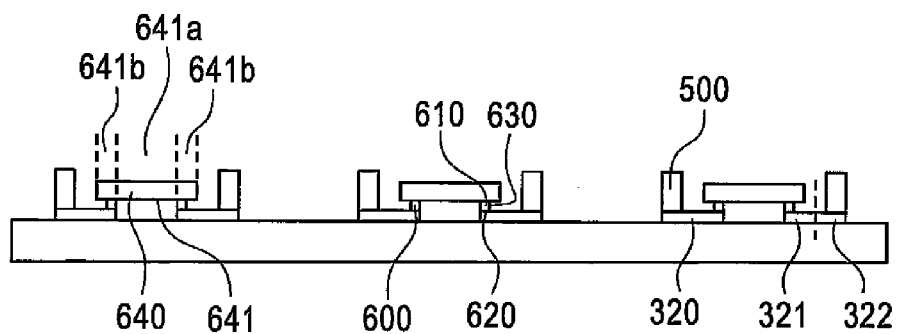
FIG. 6 is a view illustrating the manufacturing method of the semiconductor device according to the first embodiment of the present invention.

Next, as shown in FIG. 6, a bump electrode 600 is formed on a fourth region 641b of a semiconductor chip 640, and the formed bump electrode 600 is mounted onto the first region 321 of the wiring layer 320. Thus the semiconductor chip 640 is mounted on the transparent substrate 310. The bump electrode 600 is a columnar conductor comprising a top face 610, a bottom face 620 opposing the top face 610, and a side face 630 contacting the top face 610 and the bottom face 620. Here, when the semiconductor chip 640 is mounted onto the transparent substrate 320, the bottom face 620 of the bump electrode 600 is formed so as to face the wiring layer 320. The bump electrode 600 is formed by a similar process to the process for forming the columnar electrode 500, i.e. forming a seed layer through sputtering, and then forming a seed layer of the bump electrode 600 by means of a photolithographic process Note that the bump electrode 600 may also be formed by a process of forming a seed layer and growing the seed layer of the bump electrode 600 through plating, a process of forming a resist layer, providing an opening in the formed resist layer in a fourth region 641b of a third face 641 of the semiconductor chip 640, and then filling the opening with a conductive material, or another process. The semiconductor chip 640 comprises the rectangular third face 641 on which a light-receiving element or light-emitting element is formed. The top face 610 of the bump electrode 600 is mounted so as to contact the fourth region 641b of the third face 641 of the semiconductor chip 640, and thus the semiconductor chip 640 is connected electrically to the bump electrode 600. The bump electrode 600 need not be used, and instead the semiconductor chip 640 may be joined directly to the first region 321 of the wiring layer 320 by coating the first region 321 or the semiconductor chip 640 with solder, Cu, Au, or the like (not illustrated in the drawing).

Figure 7:
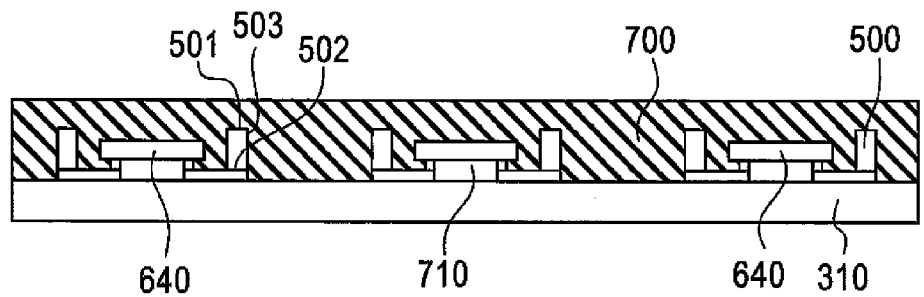
FIG. 7 is a view illustrating the manufacturing method of the semiconductor device according to the first embodiment of the present invention.

Next, as shown in FIG. 7, a sealant 700 covers the transparent substrate 310, the side face 503 of the columnar electrode 500, the top face 501 of the columnar electrode 500, and the semiconductor chip 640. Here, a three-dimensional space surrounded by the first face 311 of the transparent substrate 310, the bump electrode 600, and the third face 641 of the semiconductor chip 640 is set as a region 710. At this time, the sealant 700 is not formed on the region 710. In other words, it is sufficient that light passing through the transparent substrate 310 is not prevented from reaching the light-receiving element on the semiconductor chip 640. The sealant 700 is formed by a formation process using sealant 700 having sufficient viscosity to ensure that it does not enter the region 710. Here, if the sealant 700 is formed in an inert gas atmosphere of nitrogen gas, argon gas, or another inert gas, corrosion of the elements and wiring formed on the semiconductor chip 640 can be prevented further, leading to a further improvement in long-term reliability. Note that the sealant 700 may also be formed in a low pressure atmosphere. If such a process is employed, the likelihood of cracking can be reduced, even if air between the semiconductor chip 640 and transparent substrate 310 expands during a heating process such as reflow processing. The sealant 700 may also be formed using a process of forming a liquid resin in the boundary between the central region 3111a and peripheral region 3111b of the transparent substrate 310, and then forming the sealant 700. If this process is employed, the sealant 700 can be formed without the need to use a sealing material having sufficient viscosity to ensure that it does not enter the region 710.

Figure 8:
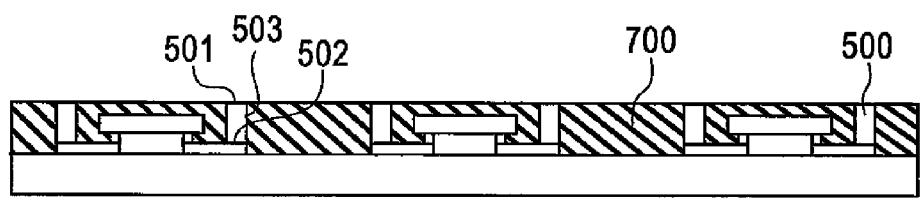
FIG. 8 is a view illustrating the manufacturing method of the semiconductor device according to the first embodiment of the present invention.

Next, as shown in FIG. 8, the top face 501 of the columnar electrode 500 is exposed. Exposure of the top face 501 of the columnar electrode 500 may be performed through a process using means such as grinding and polishing. Here, the top face 501 of the columnar electrode 500 may be exposed through a process of grinding and polishing both the sealant 700 and the columnar electrode 500, rather than simply grinding and polishing the sealant 700. By means of this process, unevenness and the like formed on the top face 501 of the columnar electrode 500 as a result of the previous processes can be removed, and hence the thickness of the semiconductor device can be reduced even further.

Figure 9:
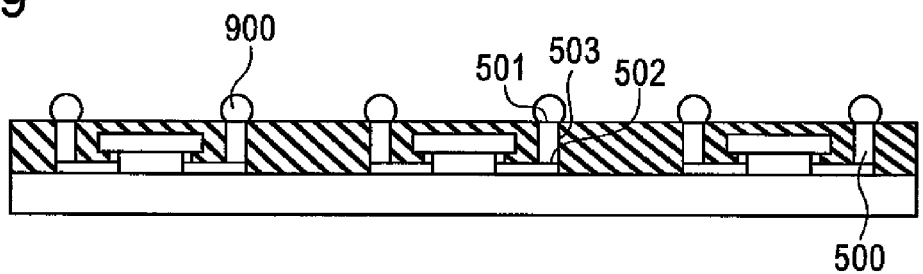
FIG. 9 is a view illustrating the manufacturing method of the semiconductor device according to the first embodiment of the present invention.

Next, as shown in FIG. 9, an external connection terminal 900 is formed on the top face 501 of the columnar electrode 500. The external connection terminal 900 is formed from a conductive material shaped into a ball form or protrusion form, and is connected to the top face 501 of the columnar electrode 500. The external connection terminal 900 may be formed through a process of printing a conductive material, a process of mounting a ball on the top face 501 of the columnar electrode 500 and fusing the ball to the top face 501 by means of reflow or the like, or another process.

Figure 10:
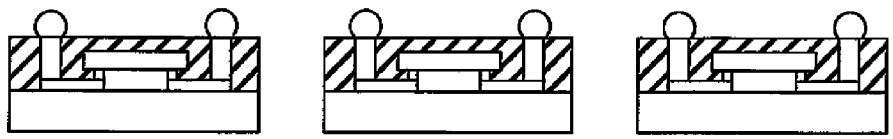
FIG. 10 is a view illustrating the manufacturing method of the semiconductor device according to the first embodiment of the present invention.

Next, as shown in FIG. 10, the substrate is cut into individual pieces in order to form the semiconductor devices. The process of cutting the substrate into individual pieces in order to form the semiconductor devices may be performed through a well-known dicing process. Here, the dicing process includes dicing using a blade and dicing using a laser. The yield of the semiconductor devices during dicing can be improved by switching between a blade and a laser according to the material to be diced.

By means of the processes described above, the semiconductor device of the first embodiment is completed.

According to the manufacturing method of the first embodiment of the present invention, manufacture of the semiconductor device comprising a light-emitting element and a light-receiving element can be realized at the wafer level, and hence the semiconductor device can be manufactured at low cost and with a small size. Further, a manufacturing method in which layers are formed in succession on the transparent substrate is employed, and hence there is no need to adhere a transparent substrate and a wafer formed with a semiconductor element together, as in the patent document-1. As a result, defects such as alignment errors between the transparent substrate and semiconductor wafer do not occur, and hence productivity can be improved.

Second Embodiment

Structure

The structure of a semiconductor device according to a second embodiment of the present invention will now be described using FIGS. 11 and 12.

Figure 11:
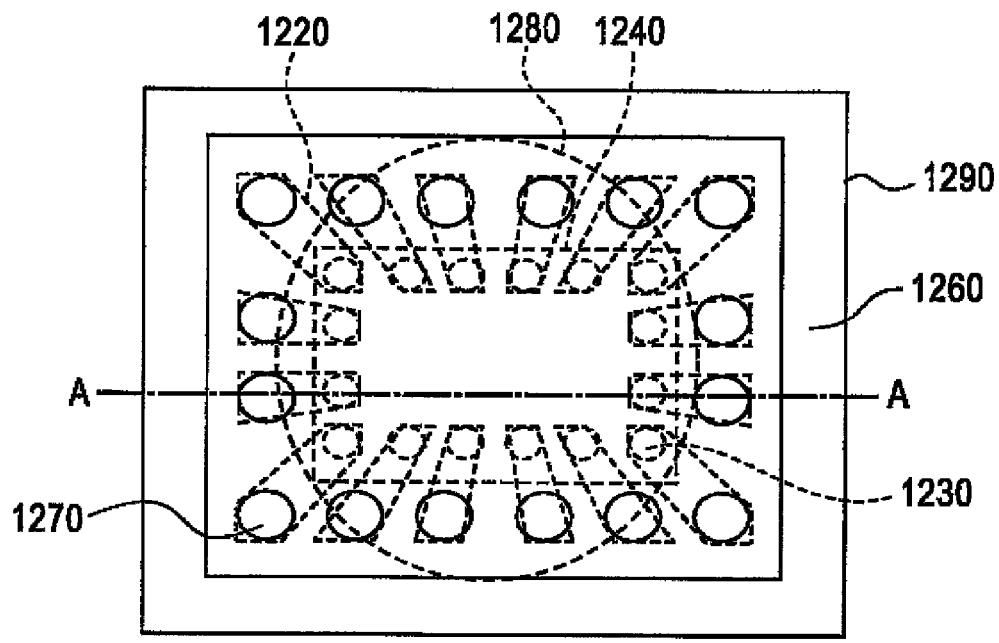
FIG. 11 is a plan view of a semiconductor device according to a second embodiment of the present invention.
Figure 12:
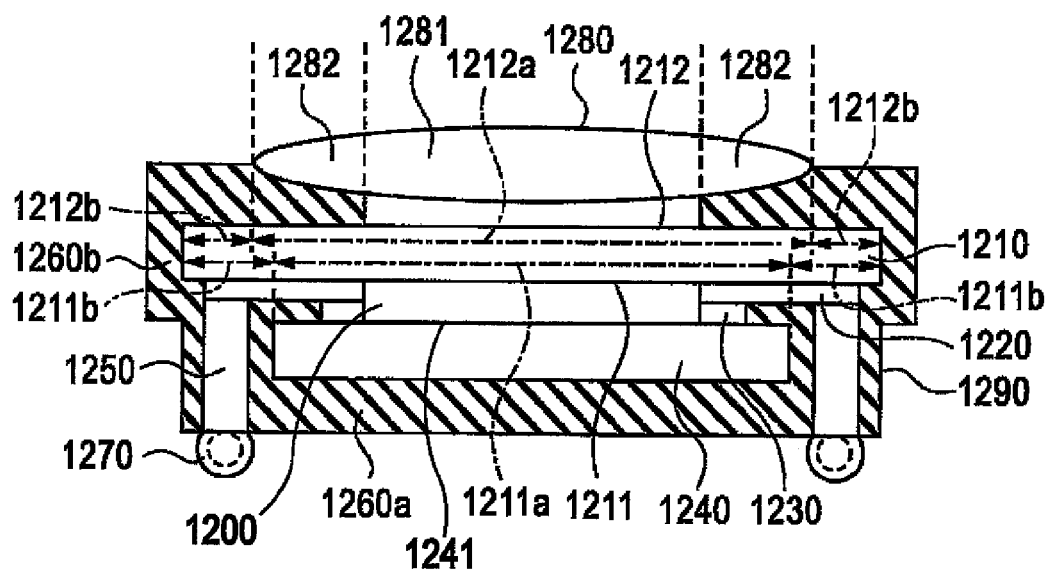
FIG. 12 is a sectional view along A-A in FIG. 11.

FIG. 11 is a plan view of the semiconductor device according to the second embodiment of the present invention, and FIG. 12 is a sectional view along A-A in FIG. 11.

As shown in FIGS. 11 and 12, the semiconductor device according to the second embodiment of the present invention includes a transparent substrate 1210, a wiring layer 1220, a bump electrode 1230, a semiconductor chip 1240, a columnar electrode 1250, a sealant 1260, an external connection terminal 1270, a lens portion 1280, and a cut surface 1290. Detailed description of constitutional parts that are identical to the first embodiment has been omitted.

The transparent substrate 1210 comprises a rectangular first face 1211 having a first central region 1211*a* and a first peripheral region 1211*b* surrounding the first central region 1211*a*, and a second face 1212 opposing the first face 1211 and having a second central region 1212*a* formed directly below the first central region 1211*a* and a second peripheral region 1212*b* surrounding the second central region 1212*a*. The transparent substrate 1210 transmits light through the first face 1211 and the second face 1212. The semiconductor chip 1240 is disposed on the first central region 1211*a* of the first face 1211 of the transparent substrate 1210 via the bump electrode 1230. The material of the transparent substrate 1210 is similar to that in the first embodiment, and hence description thereof has been omitted here.

The wiring layer 1220, bump electrode 1230, columnar electrode 1250, and semiconductor chip 1240 are constituted identically to those of the first embodiment using identical materials, and hence description thereof has been omitted here.

A sealant 1260*a* covers the transparent substrate 1210, a side face 1253 of the columnar electrode 1250, and the semiconductor chip 1240. Here, a three-dimensional space surrounded by the first central region 1211*a* of the first face 1211 of the transparent substrate 1210, the bump electrode 1230, and a third face 1241 of the semiconductor chip 1240 is set as a region 1200. At this time, the sealant 1260*a* is not formed on the region 1200. In other words, the sealant 1260*a* is formed so as no to obstruct light passing through the transparent substrate 1210 from reaching the light-receiving element on the semiconductor chip 1240. The sealant 1260*a* is constituted by an identical material to that of the first embodiment, and hence description thereof has been omitted here.

The cut surface 1290 is constituted identically to that of the first embodiment using an identical material, and hence description thereof has been omitted here.

The lens portion 1280 comprises a thick region 1281 formed directly below the second central region 1212*a* of the second face 1212 of the transparent substrate 1210, and a peripheral region 1282 surrounding the thick region 1281 of the lens portion 1280 and fixed by the sealant 1260. Glass or the like having SiO2 as its main component, for example, may be used as the material of the lens portion 1280.

A sealant 1260*b* is formed on the side face of the transparent substrate covering the peripheral region 1282 of the lens portion 1280. The sealant 1260*b* is formed such that light passing through the lens portion 1280 is not prevented from reaching the light-receiving element on the semiconductor chip 1240. The same material as that used for the sealant 1260*a* is preferably used for the sealant 1260*b*, but there are no particular specifications regarding the material as long as it is capable of fixing the lens portion 1280.

The external connection terminal 1270 is constituted identically to that of the first embodiment using an identical material, and hence description thereof has been omitted here.

According to the structure of the second embodiment of the present invention, similar effects to those of the structure of the first embodiment can be obtained. Furthermore, by forming a lens, light can be detected reliably by the light-receiving element through the lens. Moreover, the sealant covers the side face of the transparent substrate, and hence light can be prevented from entering through the side face.

[Manufacturing Method]

A manufacturing method of the semiconductor device according to the second embodiment of the present invention will be described below using FIGS. 13 to 18.

Figure 13:
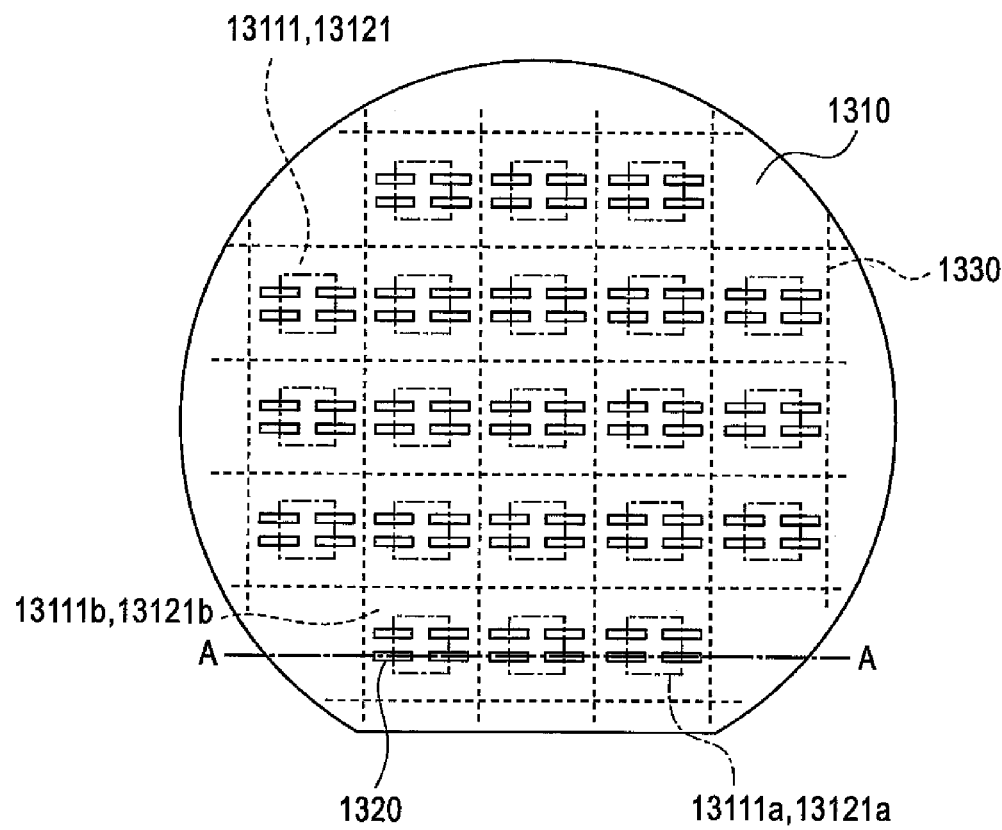
FIG. 13 is a view illustrating a manufacturing method of the semiconductor device according to the second embodiment of the present invention.
Figure 14:
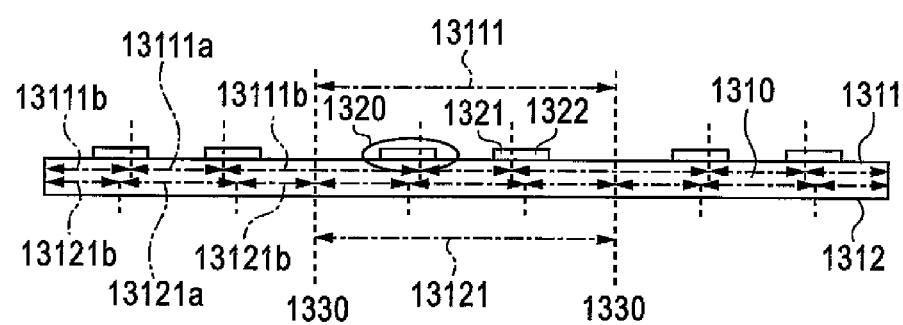
FIG. 14 is a view illustrating the manufacturing method of the semiconductor device according to the second embodiment of the present invention.

As shown in FIGS. 13 and 14, a wiring layer 1320 is formed on a transparent substrate 1310. FIG. 13 is a plan view showing a part of the manufacturing process of the semiconductor device, and FIGS. 14 to 18 are sectional views along A-A in FIG. 13. First, the wafer-form transparent substrate 1310, having a first face 1311 (top face) and a second face 1312 (bottom face) opposing the first face 1311, for transmitting light through the first face 1311 and the second face 1312, is prepared. The first face 1311 of the transparent substrate 1310 comprises a plurality of regions 13111 divided into matrix form by scribe lines 1330. Each region 13111 comprises a first central region 13111*a* and a first peripheral region 13111*b* surrounding the first central region 13111*a*. The second face 1312 comprises a plurality of regions 13121 divided into matrix form by the scribe lines 1330. Each region 13121 comprises a second central region 13121*a* disposed directly below the first central region 13111*a* of the first face 1311 and a second peripheral region 13121*b* surrounding the second central region 13121*a*. The process for forming the wiring layer 1320 is identical to that of the first embodiment, and hence description thereof has been omitted here.

Figure 15:
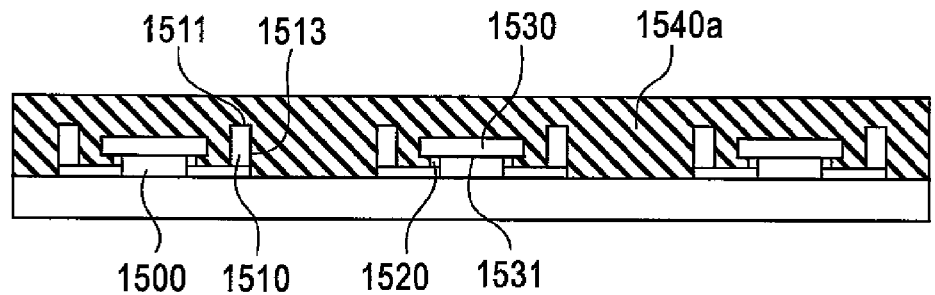
FIG. 15 is a view illustrating the manufacturing method of the semiconductor device according to the second embodiment of the present invention.

Next, the process shown in FIG. 15 will be described. The process for forming a columnar electrode 1510 and the process for forming a bump electrode 1520 and mounting a semiconductor chip 1530 on the wiring layer 1320 are identical to those used in the first embodiment, and hence description thereof has been omitted here. A sealant 1540*a* is coated on the transparent substrate 1310, a side portion 1513 of the columnar electrode 1510, a top face 1511 of the columnar electrode 1510, and the semiconductor chip 1530. Here, the sealant 1540*a* is not formed on a region 1500 surrounded by the first face 1311 of the transparent substrate 1310, the bump electrode 1520, and a first central region 1531*a* of a first face 1531 of the semiconductor chip 1530. In other words, measures should be taken to ensure that light passing through the transparent substrate 1310 is not prevented from reaching the light-receiving element on the semiconductor chip 1530. The process for forming the sealant 1540*a* is identical to that of the first embodiment, and hence description thereof has been omitted here.

Figure 16:
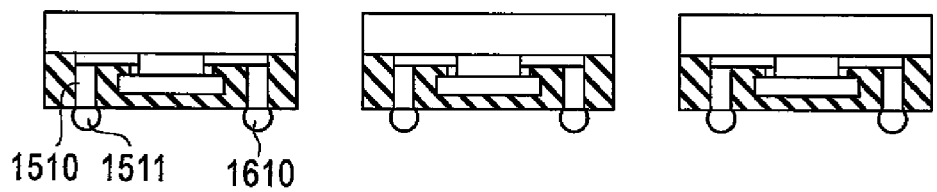
FIG. 16 is a view illustrating the manufacturing method of the semiconductor device according to the second embodiment of the present invention.

FIG. 16 shows the semiconductor device having gone through a process of exposing the top face 1511 of the columnar electrode 1510, a process of forming an external connection terminal 1610, and a process of cutting the substrate into individual pieces in order to form the semiconductor device. These processes are identical to those of the first embodiment, and hence description thereof has been omitted here.

Figure 17:
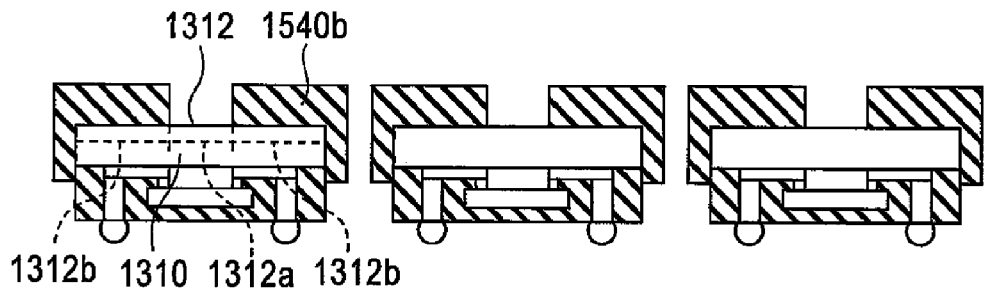
FIG. 17 is a view illustrating the manufacturing method of the semiconductor device according to the second embodiment of the present invention.

As shown in FIG. 17, a sealant 1540*b* is formed such that the second central region 13121*a* of the second face 1312 of the transparent substrate 1310 is exposed. The sealant 1540*b* is formed into a desired shape using a die or the like.

Figure 18:
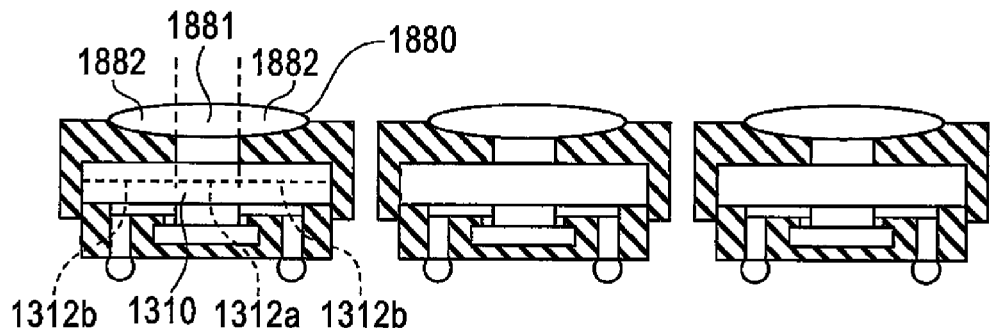
FIG. 18 is a view illustrating the manufacturing method of the semiconductor device according to the second embodiment of the present invention.

As shown in FIG. 18, a lens portion 1880 is formed on the second central region 13121*a* of the second face 1312 of the transparent substrate 1310. A peripheral portion 1882 of the lens portion 1880 is fixed by the sealant 1540*b*. Here, the lens portion 1880 can be fixed to the sealant 1540*b* through a process of fixing by crimping, a process of fixing using an adhesive, or another process. Further, the process of fixing the lens portion 1880 to the sealant 1540*b* may be performed before the process of cutting the wafer into individual pieces in order to form the semiconductor device. In this case, the process for forming the sealant 1540*b* so as to fix the lens portion 1880 is performed by covering the side face of the transparent substrate 1310* of the cut individual semiconductor device, and then covering the peripheral portion 1882 of the lens portion 1880.

By means of the processes described above, the semiconductor device of the second embodiment is completed.

According to the manufacturing method of the second embodiment of the present invention, similar effects to those of the manufacturing method of the first embodiment can be obtained. Moreover, by providing a lens, a semiconductor device with an improved light condensing capability can be formed. Further, the lens is mounted after mounting the semiconductor chip, and hence the lens can be disposed in a position which provides optimum condensing efficiency to the semiconductor chip and lens of the formed semiconductor device.

Third Embodiment

Structure

The structure of a semiconductor device according to a third embodiment of the present invention will now be described using FIGS. 19 and 20.

Figure 19:
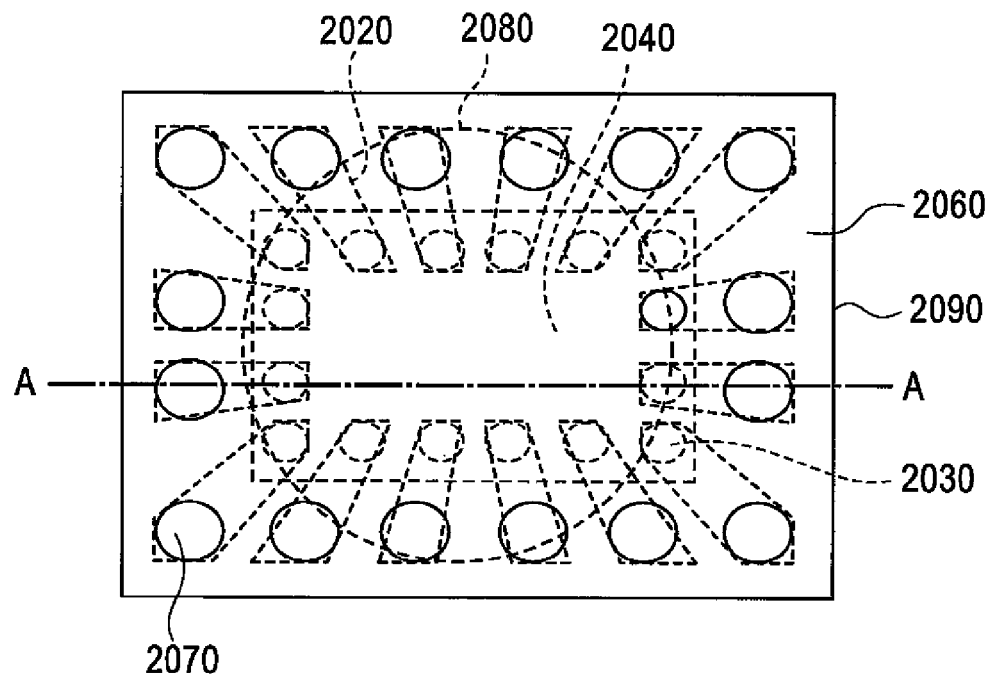
FIG. 19 is a plan view of a semiconductor device according to a third embodiment of the present invention.
Figure 20:
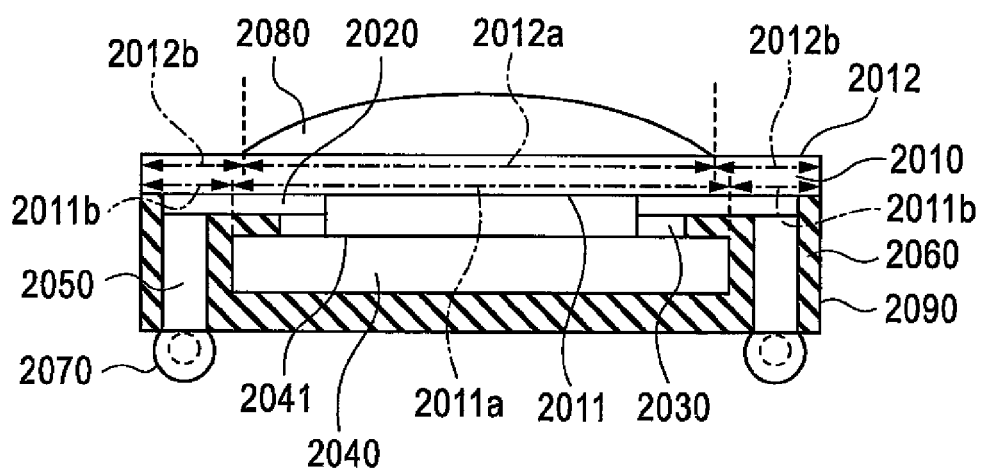
FIG. 20 is a sectional view along A-A in FIG. 19.

FIG. 19 is a plan view of the semiconductor device according to the third embodiment of the present invention, and FIG. 20 is a sectional view along A-A in FIG. 19.

As shown in FIGS. 19 and 20, the semiconductor device according to the third embodiment of the present invention includes a transparent substrate 2010, a wiring layer 2020, a bump electrode 2030, a semiconductor chip 2040, a columnar electrode 2050, a sealant 2060, an external connection terminal 2070, a lens portion 2080 formed on the transparent substrate 2010, and a cut surface 2090. Detailed description of constitutional parts that are identical to the first embodiment has been omitted.

The transparent substrate 2010 comprises a rectangular first face 2011 having a central region 2011a and a peripheral region 2011b surrounding the central region 2011a, and a second face 2012 opposing the first face 2011 and having a third region 2012a formed directly below the central region 2011a and a fourth region 2012b surrounding the third region 2012a. The transparent substrate 2010 transmits light through the first face 2011 and the second face 2012. The semiconductor chip 2040 is disposed on the central region 2011a of the first face 2011 of the transparent substrate 2010 via the bump electrode 2030 to be described below. The third region 2012a of the second face 2012 of the transparent substrate 2010 is formed with the lens portion 2080, which takes an arched protruding form and acts as a convex lens. The material of the transparent substrate 2010 is similar to that in the first embodiment, and hence description thereof has been omitted here.

The wiring layer 2020, the bump electrode 2030, the semiconductor chip 2040, the columnar electrode 2050, the sealant 2060, the external connection terminal 2070, and the cut surface 2090 are constituted identically to those of the first embodiment using identical materials, and hence description thereof has been omitted here.

According to the structure of the third embodiment of the present invention, similar effects to those of the structure of the first embodiment can be obtained. Furthermore, by forming a lens, light can be detected reliably by the light-receiving element through the lens. Also, since the transparent substrate is used to form the lens portion, a thinner semiconductor device can be provided.

[Manufacturing Method]

A manufacturing method of the semiconductor device according to the third embodiment of the present invention will be described below using FIGS. 21 to 24.

Figure 21:
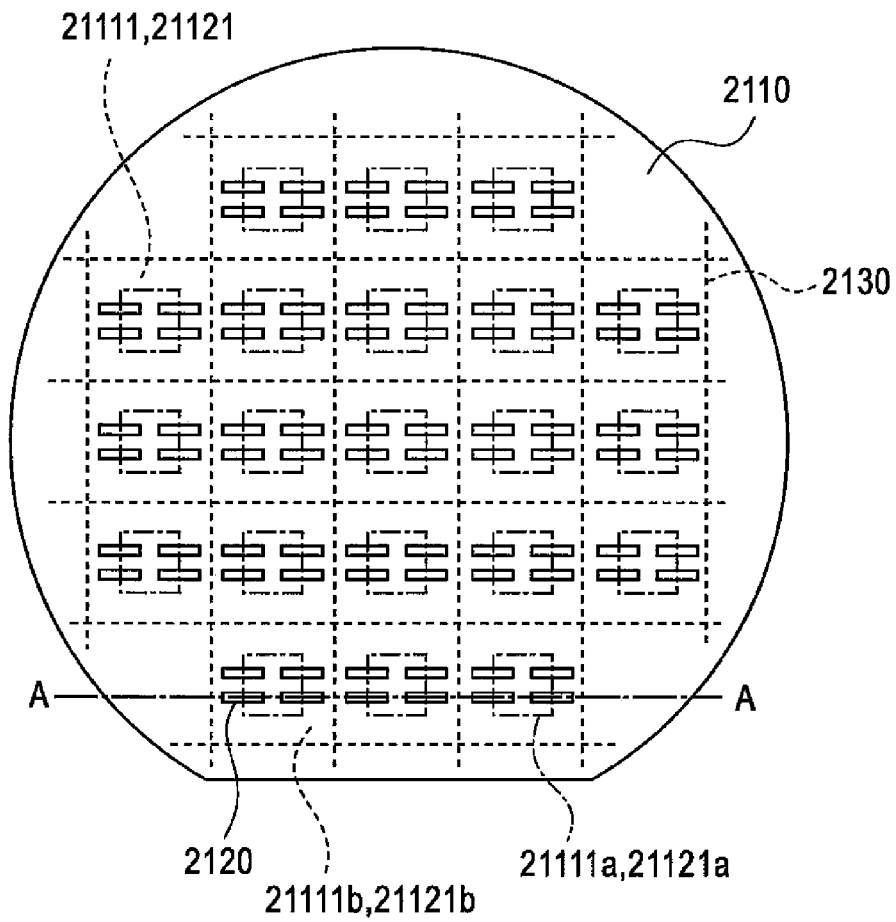
FIG. 21 is a view illustrating a manufacturing method of the semiconductor device according to the third embodiment of the present invention.
Figure 22:
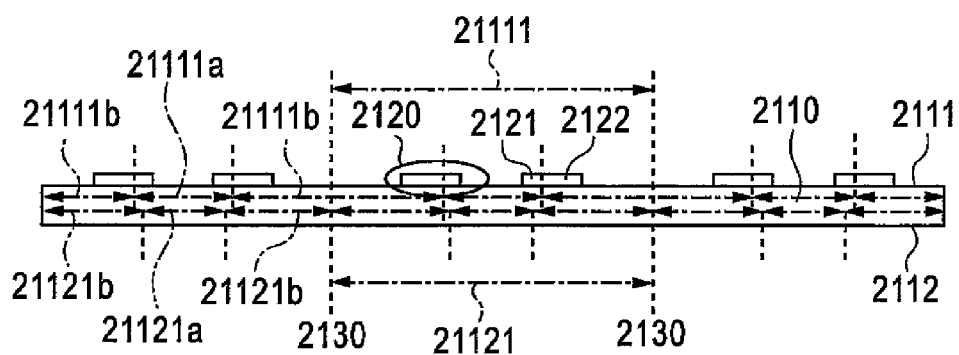
FIG. 22 is a view illustrating the manufacturing method of the semiconductor device according to the third embodiment of the present invention.
Figure 23:
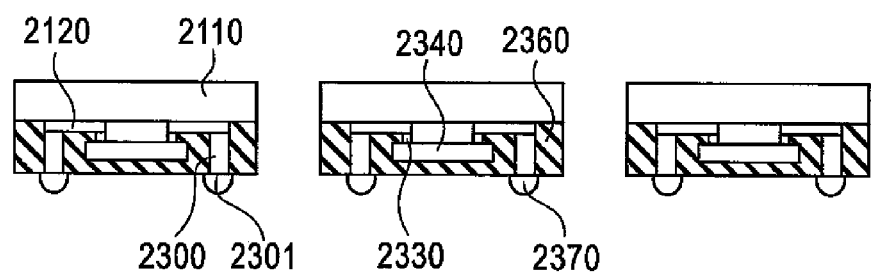
FIG. 23 is a view illustrating the manufacturing method of the semiconductor device according to the third embodiment of the present invention.
Figure 24:
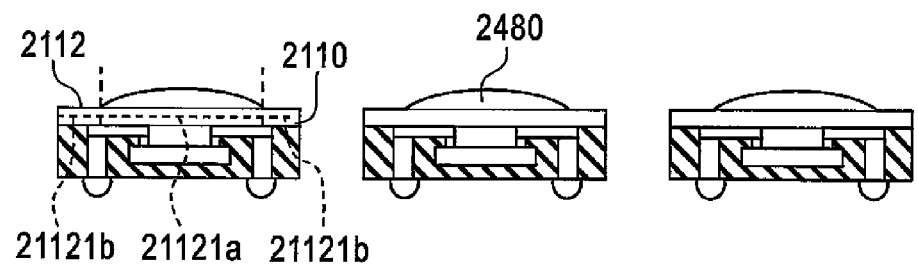
FIG. 24 is a view illustrating the manufacturing method of the semiconductor device according to the third embodiment of the present invention.

As shown in FIGS. 21 and 22, a wiring layer 2120 is formed on a transparent substrate 2110. FIG. 21 is a plan view showing a part of the manufacturing process of the semiconductor device, and FIGS. 22 to 24 are sectional views along A-A in FIG. 21. First, the wafer-form transparent substrate 2110, having a first face 2111 and a second face 2112 opposing the first face 2111, for transmitting light through the first face 2111 and the second face 2112, is prepared. The first face 2111 of the transparent substrate 2110 comprises a plurality of regions 21111 divided into matrix form by scribe lines 2130. Each region 21111 comprises a central region 21111a and a peripheral region 21111b surrounding the central region 21111a. The second face 2112 comprises a plurality of regions 21121 divided into matrix form by the scribe lines 2130. Each region 21121 comprises a third region 21121a disposed directly below the central region 21111a of the first face 2111, and a fourth region 21121b provided on the periphery of the third region 21121a so as to surround the third region 21121a. The process for forming the wiring layer 2120 is identical to that of the first embodiment, and hence description thereof has been omitted here.

Next, the process shown in FIG. 23 will be described. The process for forming a columnar electrode 2300, the process for forming a bump electrode 2330 and mounting a semiconductor chip 2340 on the bump electrode 2330, the process for forming a sealant 2360, the process for exposing a top face 2301 of the columnar electrode 2300, the process for forming an external connection terminal 2370, and the process for cutting the substrate into individual pieces to form the semiconductor device are identical to those of the first embodiment, and hence description thereof has been omitted here.

As shown in FIG. 24, a lens portion 2480 is formed by removing a part of the third region 21121a and the fourth region 21121b of the second face 2112 of the transparent substrate 2110. Here, a well-known process may be employed to form the lens portion 2480. Examples of this process include forming the lens portion 2480 by repeating a photolithographic process several times, or dripping liquid resist onto the third region 21121a, allowing the resist to harden, and removing the resist and the transparent substrate 2110 through sputtering such that the lens portion 2480 is transferred onto the transparent substrate 2110. Further, the process for forming the lens portion 2480 may be performed before the process of cutting the substrate into individual pieces to form the semiconductor device.

By means of the processes described above, the semiconductor device of the third embodiment is completed.

According to the manufacturing method of the third embodiment of the present invention, similar effects to those of the manufacturing method of the first embodiment can be obtained. Moreover, by forming the lens on the transparent substrate, a semiconductor device with an improved light condensing capability can be formed. Further, the lens is disposed after mounting the semiconductor chip, and hence the lens can be formed in a position that provides optimum condensing efficiency to the semiconductor chip and lens of the formed semiconductor device. Also, since the lens portion is formed by grinding the transparent substrate, an even thinner semiconductor device can be manufactured.

Fourth Embodiment

The structure of a semiconductor device according to a fourth embodiment of the present invention will now be described using FIGS. 25 and 26.

Figure 25:
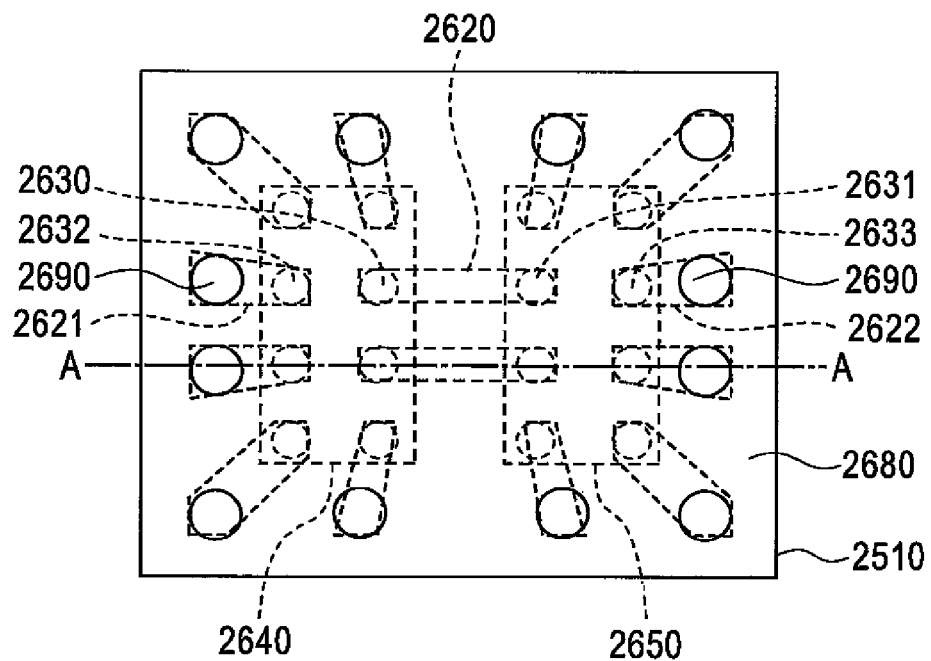
FIG. 25 is a plan view of a semiconductor device according to a fourth embodiment of the present invention.
Figure 26:
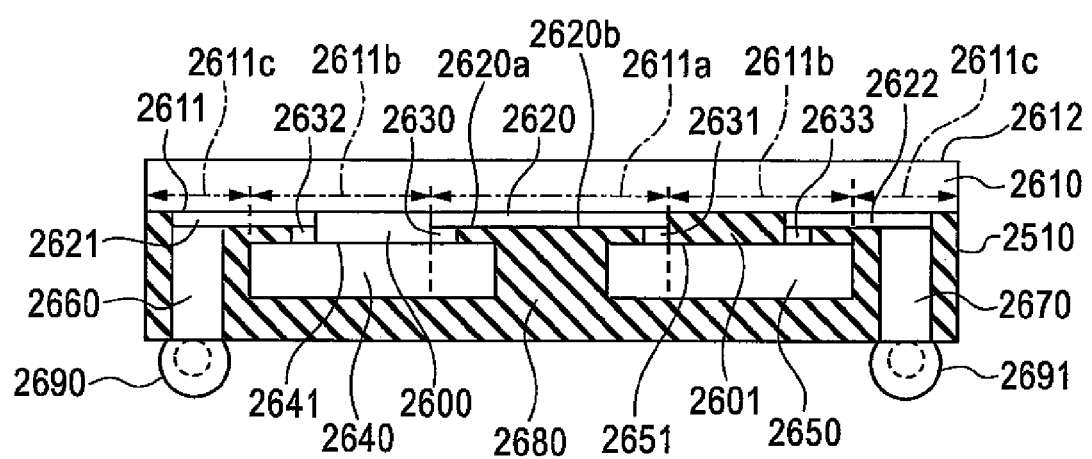
FIG. 26 is a sectional view along A-A in FIG. 25.

FIG. 25 is a plan view of the semiconductor device according to the fourth embodiment of the present invention, and FIG. 26 is a sectional view along A-A in FIG. 25.

As shown in FIGS. 25 and 26, the semiconductor device according to the fourth embodiment of the present invention includes a transparent substrate 2610, a first wiring layer 2620, a second wiring layer 2621, a third wiring layer 2622, a first bump electrode 2630, a second bump electrode 2631, a third bump electrode 2632, a fourth bump electrode 2633, a first semiconductor chip 2640, a second semiconductor chip 2650, a first columnar electrode 2660, a second columnar electrode 2670, a sealant 2680, a first external connection terminal 2690, a second external connection terminal 2691, and a cut surface 2510.

The transparent substrate 2610 comprises a rectangular first face 2611 having a first region 2611a, a second region 2611b surrounding the first region 2611a, and a third region 2611c surrounding the second region 2611b, and a second face 2612 opposing the first face 2611. As will be described below, the first semiconductor chip 2640 is disposed on the second region 2611b of the first face 2611 of the transparent substrate 2610 via the first bump electrode 2630 and the third bump electrode 2632, and the second semiconductor chip 2650 is disposed on the second region 2611b of the first face 2611 of the transparent substrate 2610 via the second bump electrode 2631 and the fourth bump electrode 2633. The material of the transparent substrate 2610 is similar to that in the first embodiment, and hence description thereof has been omitted here.

The first wiring layer 2620 is formed on the first region 2611a of the first face 2611 of the transparent substrate 2610. The second wiring layer 2621 and the third wiring layer 2622 are formed on the first face 2611 of the transparent substrate 2610, extending over the second region 2611b and the third region 2611c of the first face 2611. The form and material of the first wiring layer 2620, which comprises a fourth region 2620a and fifth region 2620b adjacent to the fourth region 2620a, the second wiring layer 2621, and the third wiring layer 2622 are similar to those described in the first embodiment, and hence description thereof has been omitted here.

The first bump electrode 2630 and the third bump electrode 2632 are formed on the first semiconductor chip 2640. The second bump electrode 2631 and fourth bump electrode 2633 are formed on the second semiconductor chip 2650. The form and material of the first bump electrode 2630, the second bump electrode 2631, the third bump electrode 2632, and the fourth bump electrode 2633 are similar to those described in the first embodiment, and hence description thereof has been omitted here.

The first columnar electrode 2660 is formed on the second wiring layer 2621 formed on the third region 2611c of the transparent substrate 2610. The second columnar electrode 2670 is formed on the third wiring layer 2622 formed on the third region 2611c of the transparent substrate 2610. The form and material of the first columnar electrode 2660 and the second columnar electrode 2670 are similar to those described in the first embodiment, and hence description thereof has been omitted here.

The first semiconductor chip 2640 is mounted on the transparent substrate 2610 via the first bump electrode 2630 and the third bump electrode 2632 such that at least the first bump electrode 2630 is disposed on first region 2611a of the transparent substrate 2610, and the third bump electrode 2632 is disposed on the second region 2611b of the transparent substrate 2610. The first semiconductor chip 2640 comprises a rectangular third face 2641, and the third face 2641 is formed with either a light-receiving element which operates in response to light, such as a photoelectric conversion element, or an image sensor such as a CCD and CMOS, or a light-emitting element such as a light-emitting diode. The first semiconductor chip 2640 is electrically connected to the first bump electrode 2630 and the third bump 2632.

The second semiconductor chip 2650 is mounted on the transparent substrate 2610 via the second bump electrode 2631 and the fourth bump electrode 2633 such that at least the second bump electrode 2631 is disposed on the first region 2611a of the transparent substrate 2610, and the fourth bump electrode 2633 is disposed on the second region 2611b of the transparent substrate 2610. The second semiconductor chip 2650 comprises a rectangular fourth face 2651, and the fourth face 2651 is formed with an element or the like for controlling the light-receiving element or the light-emitting element. The second semiconductor chip 2650 is electrically connected to the second bump electrode 2631 and the fourth bump electrode 2633.

The sealant 2680 covers the transparent substrate 2610, a side face 2663 of the first columnar electrode 2660, a side face 2673 of the second columnar electrode 2670, the first semiconductor chip 2640, and the second semiconductor chip 2650.

Here, a three-dimensional space surrounded by the first face 2611 of the transparent substrate 2610, the first bump electrode 2630, the third bump electrode 2632, and the third face 2641 of the first semiconductor chip 2640 is set as a first area 2600, and a three-dimensional space surrounded by the first face 2611 of the transparent substrate 2610, the second bump electrode 2631, the fourth bump electrode 2633, and the fourth face of the second semiconductor chip 2650 is set as a second area 2601. At this time, the sealant 2680 is not formed on the first area 2600. In other wards, measures should be taken to ensure that light passing through the light-receiving element on the first semiconductor chip 2640. Furthermore, it is not necessary that the sealant 2680 is formed in a second area 2601 which is a three-dimensional space.

The sealant 2680 is constituted by an identical material to that of the first embodiment, and hence description thereof has been omitted here.

The cut surface 2510 is constituted identically to that of the first embodiment using an identical material, and hence description thereof has been omitted here.

The first external connection terminal 2690 is formed from a conductive material shaped into a ball form or protrusion form, and is connected to a top face 2661 of the first columnar electrode 2660. The second external connection terminal 2691 is formed from a conductive material shaped into a ball form or protrusion form, and is connected to a top face 2671 of the second columnar electrode 2670. Here, the form and material of the first external connection terminal 2690 and the second external connection terminal 2691 are identical to those of the first embodiment, and hence description thereof has been omitted here.

According to the structure of the fourth embodiment of the present invention, a semiconductor device which does not use a ceramic header, and which comprises a light-emitting element, a light-receiving element, and a control element for controlling the light-emitting the light-emitting element and light-receiving element is provided, and hence the final package structure can be reduced in size. Further, by forming sealant around the columnar electrodes, the sealant protects against external shocks, thereby reducing the likelihood of a short circuit or disconnection of the wiring patterns, as occurs in the semiconductor device of the patent document-1. Further, the sealant does not cover the semiconductor chip having the light-receiving element, but the semiconductor chip controlling the light-receiving element. The semiconductor chip controlling the light-receiving element receives light and causes the photoelectric effect, causing the possibility for having defects to reduce. Further, even though the chip having the element controlling light-receiving element becomes insufficient for a photoelectric effect, etc., it may be a structure with which the chip having the element controlling light-receiving element is not covered with the sealant. In this case, the semiconductor chip having the light-receiving element and the semiconductor chip controlling the light-receiving element have similar structures. Therefore, the similar structure makes the manufacturing process simple. Further, by forming the external connection terminal in such a manner that the external connection terminal is melted, coated onto an external electrode and the columnar electrode, and then hardened so as to be connected to the external electrode and columnar electrode, the reliability of the connection between the external electrode and the columnar electrode can be improved. Here, a ball formed from a resin or metal core material and coated with a fused metal is used as the external connection terminal, and hence height variation during packaging can also be avoided. When an external connection terminal having a core material is used, the fused metal covering the periphery of the core material is melted and then coated onto the external electrode and columnar electrode, whereas the core material is sandwiched between the external electrode and columnar electrode without being melted. Hence when the semiconductor device is mounted onto an external substrate, the gap between the external substrate and semiconductor device can be made equal to the height of the core material, thereby preventing height variation during packaging. As a result, the semiconductor device can be connected parallel to the external substrate, thus reducing errors relating to light transmission during packaging. Moreover, the cut surface is constituted by two layers, i.e. the single sealant and the transparent substrate, and hence the resin layer boundary lines described in the parent document-2 do not exist As a result, defects such as breakage of the resin parts can be avoided even during a heating process such as reflow processing, and moisture or the like can be prevented from infiltrating between the resin layers, leading to an improvement in long-term reliability with no corrosion or characteristic abnormalities in the wiring and semiconductor chip.

[Manufacturing Method]

A manufacturing method of the semiconductor device according to the fourth embodiment of the present invention will be described below using FIG. 27 to 34.

Figure 27:
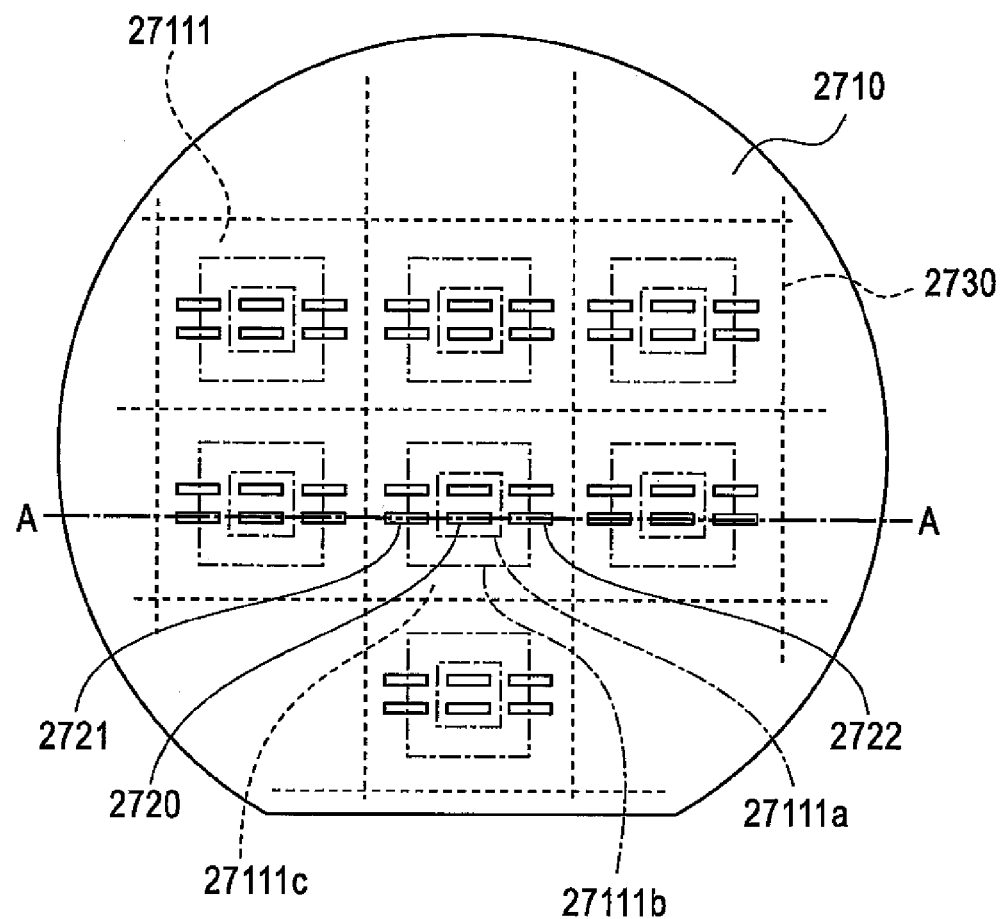
FIG. 27 is a view illustrating a manufacturing method of the semiconductor device according to the fourth embodiment of the present invention.
Figure 28:
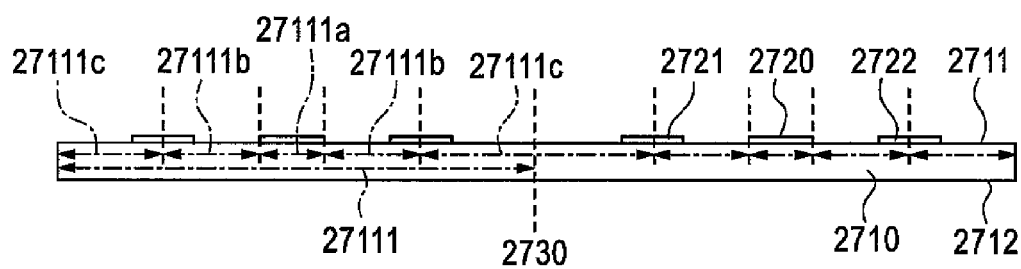
FIG. 28 is a view illustrating the manufacturing method of the semiconductor device according to the fourth embodiment of the present invention.

As shown in FIGS. 27 and 28, a first wiring layer 2720, a second wiring layer 2721, and a third wiring layer 2722 are formed on a transparent substrate 2710. FIG. 27 is a plan view showing a part of the manufacturing process of the semiconductor device, and FIG. 28 to 34 are sectional view along A-A in FIG. 27. First, the wafer-form transparent substrate 2710, having a first face 2711 and a second face 2712 opposing the first face 2711, for transmitting light through the first face 2711 and the second face 2712, is prepared. The first face 2711 of the transparent substrate 2710 comprises a plurality of regions 27111 divided into matrix form by scribe line 2730. Each region 27111 comprises a first region 27111a, a second region 27111b surrounding the first region 27111a, and a third region 27111c surrounding the second region 27111b. The processes for forming the first wiring layer 2720, which comprises a fourth region 2720a and a fifth region 2720b adjacent to the fourth region 2720a, the second wiring layer 2721, and the third wiring layer 2722 are similar to those described in the first embodiment, and hence detailed description thereof has been omitted here.

Figure 29:
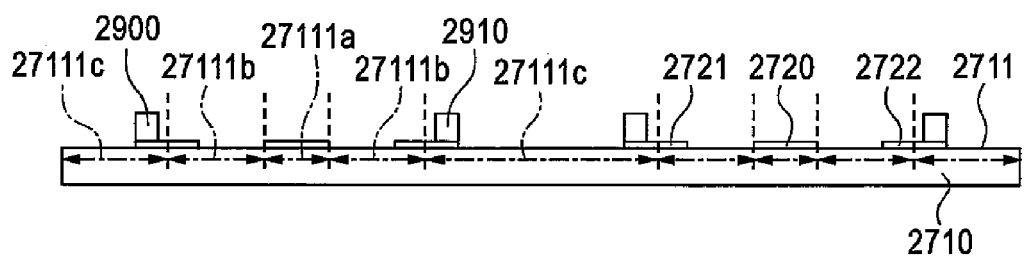
FIG. 29 is a view illustrating the manufacturing method of the semiconductor device according to the fourth embodiment of the present invention.

Next, as shown in FIG. 29, a first columnar electrode 2900 is formed on the second wiring layer 2721 formed on the third region 27111c of the first face 2711 of the transparent substrate 2710, and a second columnar electrode 2910 is formed on the third wiring layer 2722 formed on the third region 27111c of the first face 2711. The form and formation process of the first columnar electrode 2900 and the second columnar electrode 2910 are similar to those described in the first embodiment, and hence description thereof has been omitted here.

Figure 30:
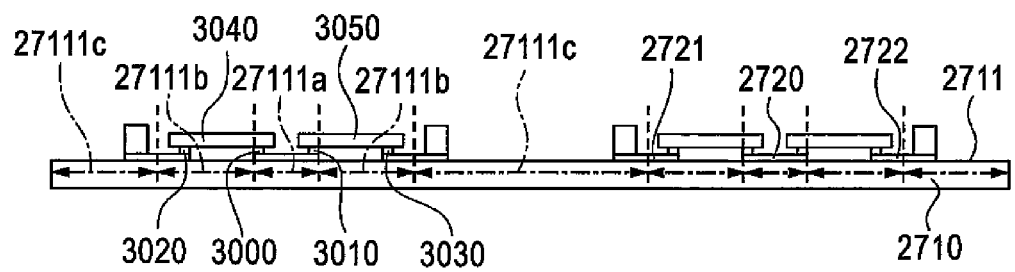
FIG. 30 is a view illustrating the manufacturing method of the semiconductor device according to the fourth embodiment of the present invention.

Next, as shown in FIG. 30, a first bump electrode 3000 is formed on the first wiring layer 2720 formed on the first region 27111a of the first face 2711 of the transparent substrate 2710, a third bump electrode 3020 is formed on the second wiring layer 2721 formed on the second region 27111b of the first face 2711, and a first semiconductor chip 3040 is mounted on the formed first bump electrode 3000 and the third bump electrode 3020. Further, a second bump electrode 3010 is formed on the first wiring layer 2720, a fourth bump electrode 3030 is formed on the third wiring layer 2722 formed on the second region 27111b of the first face 2711 of the transparent substrate 2710, and a semiconductor chip 3050 is mounted on the formed second bump electrode 3010 and the fourth bump electrode 3030. The form and formation process of the first bump electrode 3000, the second bump electrode 3010, the third bump electrode 3020, and fourth bump electrode 3030 are similar to those described in the first embodiment, and hence description thereof has been omitted. The form and mounting process of the first semiconductor chip 3040 and the second semiconductor chip 3050 are also similar to those described in the first embodiment, and hence description thereof has been omitted.

Figure 31:
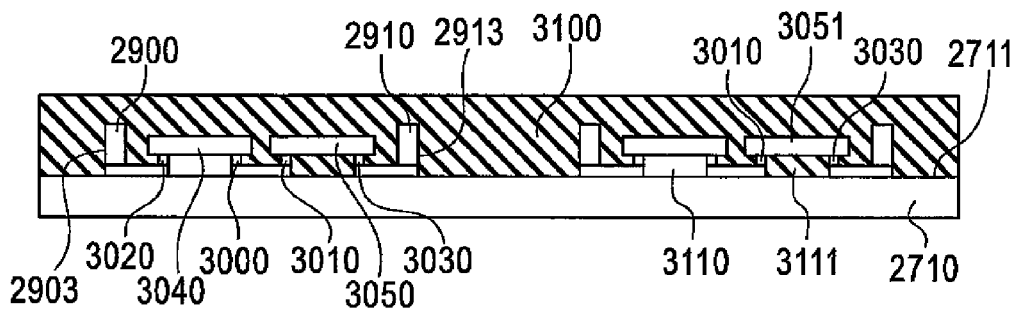
FIG. 31 is a view illustrating the manufacturing method of the semiconductor device according to the fourth embodiment of the present invention.

Next, as shown in FIG. 31, a sealant 3100 is coated onto the transparent substrate 2710, a side face 2903 of the first columnar electrode 2900, a side face 2913 of the second columnar electrode 2910, the first semiconductor chip 3040, and the second semiconductor chip 3050. Here, a three-dimensional space surrounded by the first face 2711 of the transparent substrate 2710, the first bump electrode 3000, the third bump electrode 3020, and the first semiconductor chip 3040 is set as a first area 3110, and a three-dimensional space surrounded by the first face 2711 of the transparent substrate 2710, the second bump electrode 3010, the fourth bump electrode 3030, and the second semiconductor chip 3050 is set as a second area 3111. At this time, the sealant 3100 is not formed on the first area 3110. In other wards, measures should be taken to ensure that light passing through the transparent substrate 2710 is not prevented from reaching the light-receiving element on the first semiconductor chip 3040. The material of the sealant 3100 has viscosity enough to keep from moving into the first area 3110. At this time, to simplify the manufacturing process of the sealant 3100, the sealant 3100 may not to be formed in the second area 3111. In this case, the selection of the sealant material can be omitted. That is, the sealant material may be selected that has viscosity enough to keep from moving into the first area 3110 and the second area 3111. Further, the sealant may cover the semiconductor chip controlling the light-receiving element or the light-emitting element. Because, the semiconductor chip controlling the light-receiving element or the light-emitting element receives light and causes the photoelectric effect by light. Therefore, the semiconductor chip has possibility of causing trouble by light. In this case, the method of forming the sealant 3100 includes the method of selecting the sealant of the viscosity that the sealant 3100 can enter in the second area from among the sealant of the viscosity that the sealant 3100 can not enter in the first area, or the method of forming the sealant 3100 by the method similar to those described the first embodiment after the sealant is formed in the second area. Further, the method of forming the sealant 3100 also includes the method of narrowing the interval of each bump electrode formed the first semiconductor chip 3040 more than the interval of each bump electrode formed the second semiconductor chip 3050 and forming the sealant 3100. At this time, to narrow the interval of each bump electrode on the first semiconductor chip, a dummy bump electrode that does not exchange an electric signal may be formed. Further, the method that the second area 3111 shutting out light includes the method that the through hole that reaches the second area 3111 is formed to a transparent substrate 2710 after the sealant 3100 is formed, and the sealant is infected through the through hole, or the method that the second semiconductor chip 3050 is mounted on the second bump electrode 3010 and the fourth bump electrode 3030 after seat is pasted to the second area part of transparent substrate 2710. The formation process of the sealant 3100 can apply the method of the description to the first embodiment together as methods other than the above-described methods. That is, it is possible to do the formation process of the sealant 3100 after the process of making it under the inert gas atmosphere of the nitrogen gas and the argon gas, etc. is done, and it is possible to the formation process of the sealant 3100 after a liquid resin is formed in surroundings of the first semiconductor chip 3040.

Figure 32:
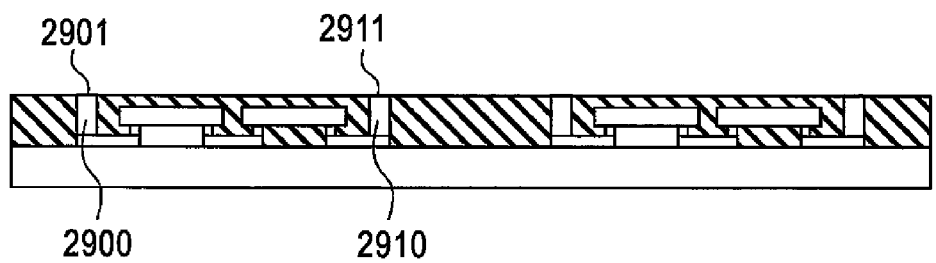
FIG. 32 is a view illustrating the manufacturing method of the semiconductor device according to the fourth embodiment of the present invention.

Next, as shown in FIG. 32, a top face 2901 of the first columnar electrode 2900 and a top face 2911 of the second columnar electrode 2910 are exposed. The process for exposing the top face 2901 of the first columnar electrode 2900 and the top face 2911 of the second columnar electrode 2910 is similar to that in the first embodiment, and hence description thereof has been omitted here.

Figure 33:
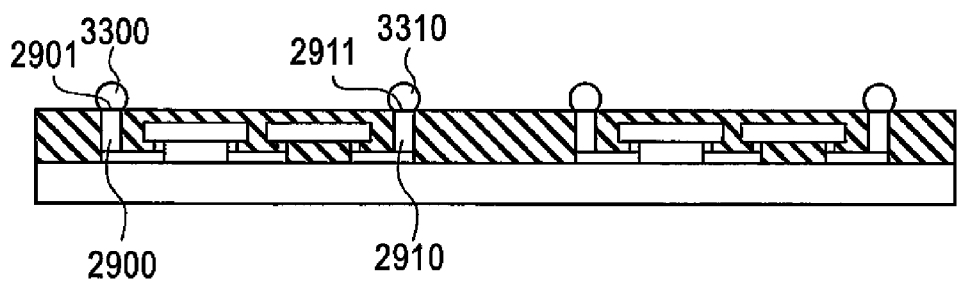
FIG. 33 is a view illustrating the manufacturing method of the semiconductor device according to the fourth embodiment of the present invention.

Next, as shown in FIG. 33, a first external connection terminal 3300 is formed on the top face 2901 of the first columnar electrode 2900, and a second connection external 3310 is formed on the top face 2911 of the second columnar electrode 2910. The form and formation process of the first external connection terminal 3300 and the second external connection terminal 3310 are similar to those described in the first embodiment, and hence description thereof has been omitted here.

Figure 34:
FIG. 34 is a view illustrating the manufacturing method of the semiconductor device according to the fourth embodiment of the present invention.

Next, as shown in FIG. 34, the substrate is cut into individual pieces in order to form the semiconductor devices. The process for cutting the substrate into individual pieces in order to form the semiconductor device is similar to that in the first embodiment, and hence description thereof has been omitted here.

By means of the processes described above, the semiconductor device of the fourth embodiment is completed, According to the manufacturing method of the fourth embodiment of the present invention, the manufacture of a semiconductor device comprising a light-omitting element, a light-receiving element, and a control element for controlling the light-emitting element and the light-receiving element can be realized at the wafer level, and hence the semiconductor device can be manufactured at low cost and with a small size. Further, a manufacturing method in which layers are formed in succession on the transparent substrate is employed, and hence there is no need to adhere a transparent substrate and a wafer formed with a semiconductor element together, as in the patent document-1. As a result, defects such as alignment errors between the transparent substrate and the semiconductor chip comprising the light-emitting element and the light-receiving element do not occur, and hence productivity can be improved.

Fifth Embodiment

The structure of a semiconductor device according to a fifth embodiment of the present invention will now be described using FIGS. 35 and 36.

Figure 35:
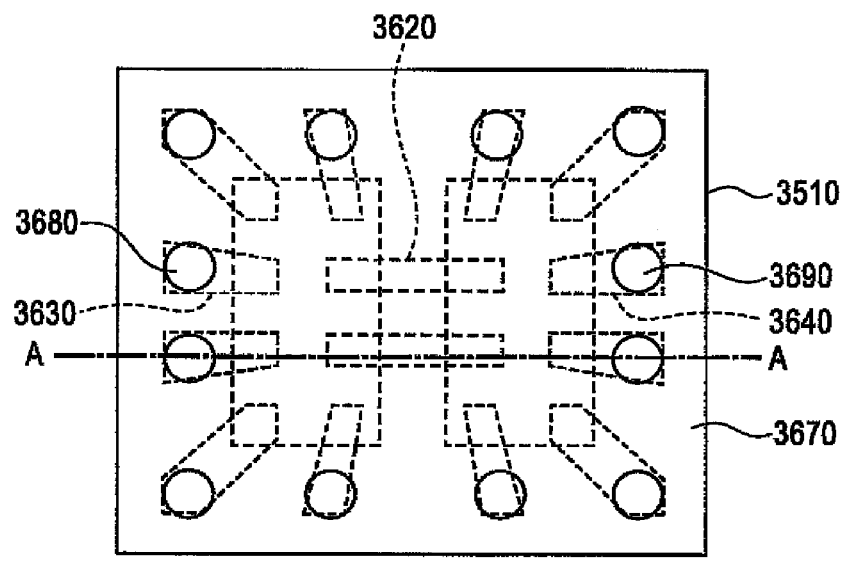
FIG. 35 is a plan view of a semiconductor device according to a fifth embodiment of the present invention.
Figure 36:
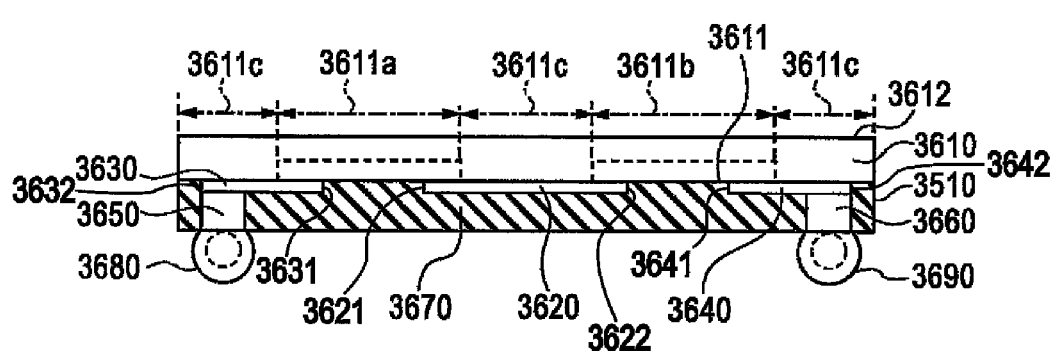
FIG. 36 is a sectional view along A-A in FIG. 35*.

FIG. 35 is a plan view of the semiconductor device according to the fifth embodiment of the present invention, and FIG. 36 is a sectional view along A-A in FIG. 35.

As shown in FIGS. 35 and 36, the semiconductor device according to the fifth embodiment of the present invention includes a transparent substrate 3610, a first wiring layer 3620, a second wiring layer 3630, a third wiring layer 3640, a first columnar electrode 3650, a second columnar electrode 3660, a sealant 3670, a first external connection terminal 3680, a second external connection terminal 3690, and a cut surface 3510.

The transparent substrate 3610 comprises a rectangular first face 3611 having a first region 3611a, a second region 3611b, and a third region 3611c surrounding the first region 3611a and the second region 3611b, and a second face 3612 opposing the first face 3611. The transparent substrate 3610 transmits light through the first face 3611 and the second face 3612. The first region 3611a of the first face 3611 of the transparent substrate 3610 is formed with a light-emitting element or a light-receiving element, and the second region 3611b of the first face 3611 is formed with a control element for controlling the light-emitting element and the light-receiving element. Examples of the material of the transparent substrate 3610 include sapphire, GaAs, GaN, or another conventional transparent substrate on which elements can be formed.

The first wiring layer 3620 is formed in a rectangular shape having a first short side 3621 and a second short side 3622. The first short side 3621 of the first wiring layer 3620 is formed on the first region 3611a of the first face 3611 of the transparent substrate 3610, and the second short side 3622 thereof is formed on the second region 3611b of the first face 3611. The first wiring layer 3620 is formed so as to electrically connect the light-emitting element, the light-receiving element, and the control element for controlling the light-emitting element and the light-receiving element. The second wiring layer 3630 is formed in a rectangular shape having a third short side 3631 and a fourth short side 3632. The third short side 3631 of the second wiring layer 3630 is formed on the first region 3611a of the first face 3611 of the transparent substrate 3610, and the fourth short side 3632 thereof is formed on the third region 3611c of the first face 3611. The second wiring layer 3630 is formed so as to electrically connect the first columnar electrode 3650, to be described below, to the light-emitting element and the light-receiving element. The third wiring layer 3640 is formed in a rectangular shape having a fifth short side 3641 and a sixth short side 3642. The fifth short side 3641 of the third wiring layer 3640 is formed on the second region 3611b of the first face 3611 of the transparent substrate 3610, and the sixth short side 3642 thereof is formed on the third region 3611c of the first face 3611. The third wiring layer 3640 is formed so as to electrically connect the second columnar electrode 3660, to be described below, to the control element for controlling the light-emitting element and the light-receiving element. The form and material of the first wiring layer 3620, the second wiring layer 3630, and the third wiring layer 3640 are similar to those described in the first embodiment, and hence description thereof has been omitted here.

The first columnar electrode 3650 is formed on the second wiring layer 3630 formed on the third region 3611c of the first face 3611 of the transparent substrate 3610. The second columnar electrode 3660 is formed on the third wiring layer 3640 formed on the third region 3611c of the first face 3611 of the transparent substrate 3610. The form and material of the first columnar electrode 3650 and the second columnar electrode 3660 are similar to those described in the first embodiment, and hence description thereof has been omitted here.

The sealant 3670 is formed to cover the first face 3611 of the transparent substrate 3610, a side face 3653 of the first columnar electrode 3650, and a side face 3663 of the second columnar electrode 3660. Here, the sealant 3670 should be formed such that when light passing through the transparent substrate 3610 reaches the light-receiving element formed on the transparent substrate 3610, the light does not escape to the rear face side. The material of the sealant 3670 is similar to that in the first embodiment, and hence description thereof has been omitted here.

The cut surface 3510 is a surface formed by dicing, and serves as a constitutional part of the semiconductor device. The cut surface 3510 is constituted by only two layers, the single type sealant 3670 and the transparent substrate 3610. Here, the phrase "constituted by only two layers" in the claims indicates that the materials constituting the cut surface are made up of these two layers. However, even when an adhesive member for adhering the two layers together, a protective film for protecting the semiconductor element formed on the transparent substrate, and so on exist between the single type sealant 3670 and transparent substrate 3610, for example, the existence of these components is included in the expression "constituted by only two layers". In other words, even when a layer exists between the sealant 3670 and transparent substrate 3610 constituting the cut surface 3510, as long as this layer cannot function alone as a sealant and is sufficiently thinner than the sealant 3670, the existence of the layer is included in the expression "constituted by only two layers".

The first external connection terminal 3680 is formed from a conductive material shaped into a ball form or protrusion form, and is connected to a top face 3651 of the first columnar electrode 3650. The second external connection terminal 3690 is formed from a conductive material shaped into a ball form or protrusion form, and is connected to a top face 3661 of the second columnar electrode 3660. The conductive material is similar to that in the first embodiment, and hence description thereof has been omitted here.

According to the structure of the fifth embodiment of the present invention, similar effects to those of the structure of the fourth embodiment can be obtained. Furthermore, the light-emitting element, the light-receiving element, and control element for controlling the light-emitting element and the light-receiving element are formed on the transparent substrate, and hence a further reduction in thickness can be realized.

[Manufacturing Method]

A manufacturing method of the semiconductor device according to the fifth embodiment of the present invention will be described below using FIGS. 37 to 43.

Figure 37:
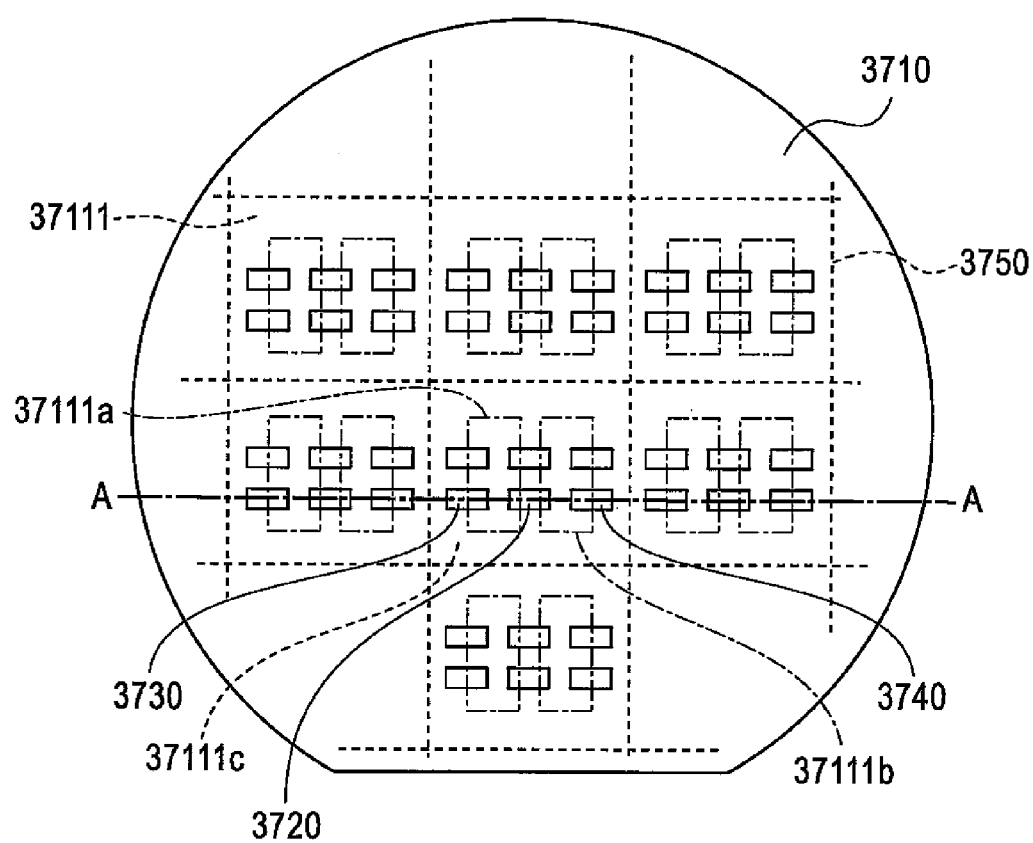
FIG. 37 is a view illustrating a manufacturing method of the semiconductor device according to the fifth embodiment of the present invention.
Figure 38:
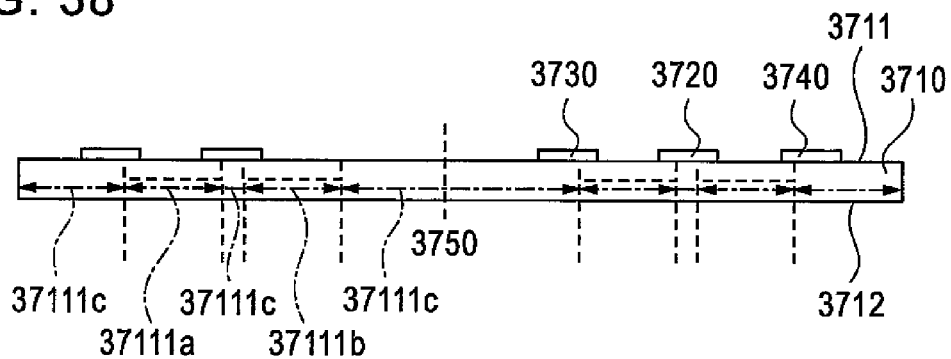
FIG. 38 is a view illustrating the manufacturing method of the semiconductor device according to the fifth embodiment of the present invention.

As shown in FIGS. 37 and 38, a first wiring layer 3720, a second wiring layer 3730, and a third wiring layer 3740 are formed on a transparent substrate 3710 formed with a light-emitting element, a light-receiving element, and a control element for controlling the light-emitting element and the light-receiving element. FIG. 37 is a plan view showing a part of the manufacturing process of the semiconductor device, and FIGS. 38 to 43 are sectional views along A-A in FIG. 37. First, the wafer-form transparent substrate 3710, having a first face 3711 and a second face 3712 opposing the first face 3711, for transmitting light through the first face 3711 and the second face 3712, is prepared. The first face 3711 of the transparent substrate 3710 comprises a plurality of regions 37111 divided into matrix form by scribe lines 3750. Each region 37111 comprises a first region 37111a, a second region 37111b, and a third region 37111c surrounding the first region 37111a and the second region 37111b. Using conventional techniques, the light-emitting element and the light-receiving element are formed on the first region 37111a, and the control element for controlling the light-emitting element and the light-receiving element is formed on the second region 37111b. The processes for forming the first wiring layer 3720, the second wiring layer 3730, and the third wiring layer 3740 are similar to those described in the first embodiment, and hence detailed description thereof has been omitted here.

Figure 39:
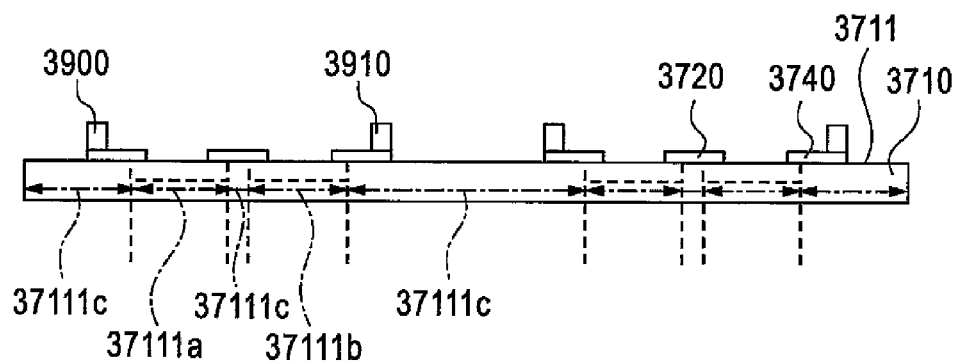
FIG. 39 is a view illustrating the manufacturing method of the semiconductor device according to the fifth embodiment of the present invention.

Next, as shown in FIG. 39, a first columnar electrode 3900 is formed on the second wiring layer 3730 formed on the third region 37111c of the first face 3711 of the transparent substrate 3710, and simultaneously, a second columnar electrode 3910 is formed on the third wiring layer 3740 formed on the third region 37111c of the first face 3711*. The form and formation process of the first columnar electrode 3900 and the second columnar electrode 3910 are similar to those described in the first embodiment, and hence detailed description thereof has been omitted here.

Figure 40:
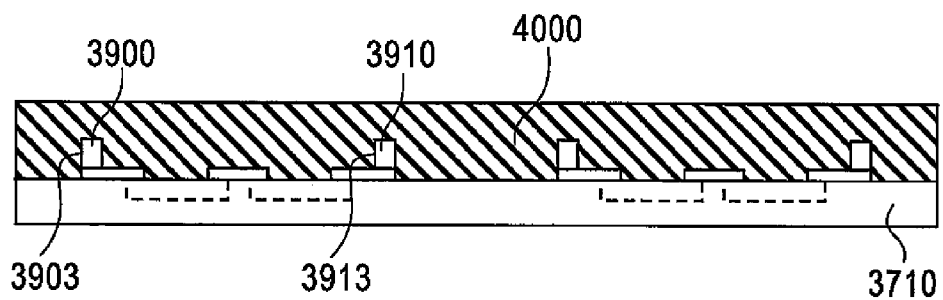
FIG. 40 is a view illustrating the manufacturing method of the semiconductor device according to the fifth embodiment of the present invention.

Next, as shown in FIG. 40, a sealant 4000 is formed so as to cover the first face 3711 of the transparent substrate 3710, a side face 3903 of the first columnar electrode 3900, and a side face 3913 of the second columnar electrode 3910. The sealant 4000 may be formed using a conventional, well-known process.

Figure 41:
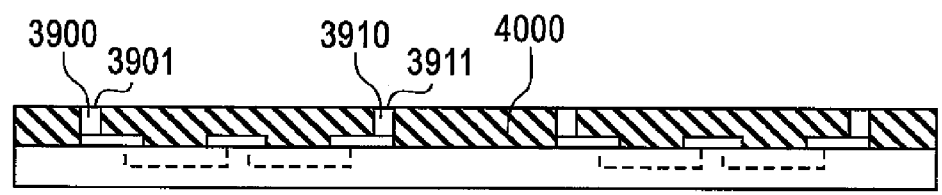
FIG. 41 is a view illustrating the manufacturing method of the semiconductor device according to the fifth embodiment of the present invention.

Next, as shown in FIG. 41, a top face 3901 of the first columnar electrode 3900 and a top face 3911 of the second columnar electrode 3910 are exposed. The process for exposing the top face 3901 of the first columnar electrode 3900 and the top face 3911 of the second columnar electrode 3910 is similar to that in the first embodiment, and hence detailed description thereof has been omitted here.

Figure 42:
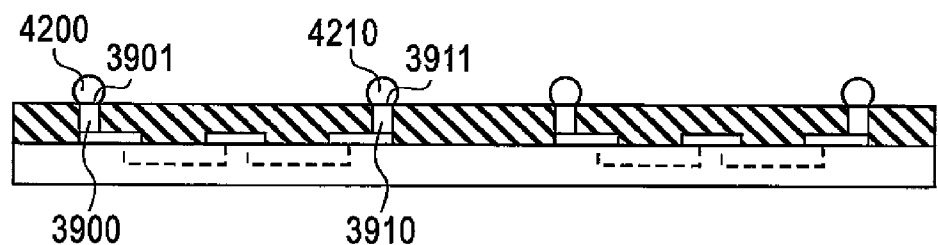
FIG. 42 is a view illustrating the manufacturing method of the semiconductor device according to the fifth embodiment of the present invention.

Next, as shown in FIG. 42, a first external connection terminal 4200 is formed on the top face 3901 of the first columnar electrode 3900, and simultaneously, a second external connection terminal 4210 is formed on the top face 3911 of the second columnar electrode 3910. The formation process of the first external connection terminal 4200 and the second external connection terminal 4210 is similar to that in the first embodiment, and hence detailed description thereof has been omitted here.

Figure 43:
FIG. 43 is a view illustrating the manufacturing method of the semiconductor device according to the fifth embodiment of the present invention.
Figure 44:
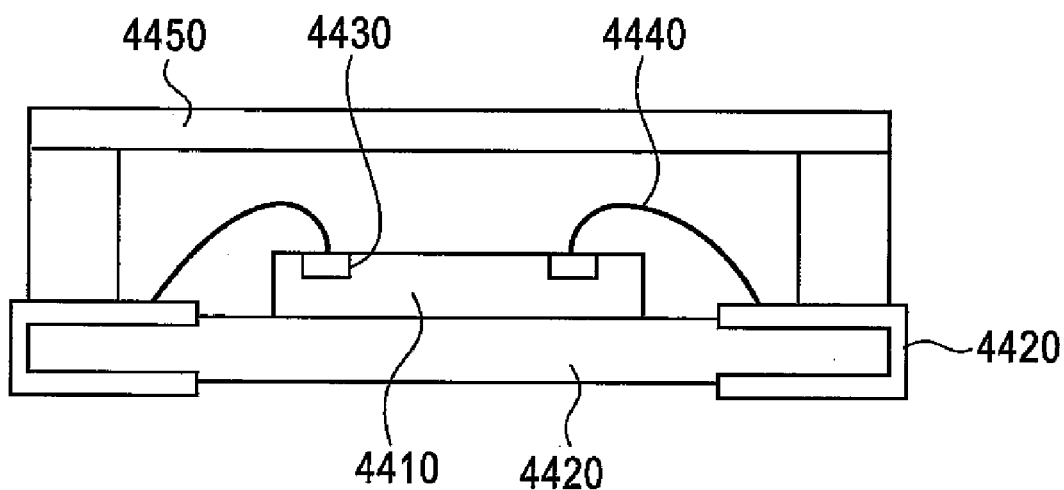
FIG. 44 is a sectional view showing a conventional semiconductor device.

Next, as shown in FIG. 43, the substrate is cut into individual pieces in order to form the semiconductor device. The process for cutting the substrate into individual pieces in order to form the semiconductor device is similar to that in the first embodiment, and hence detailed description thereof has been omitted here.

By means of the processes described above, the semiconductor device of the fifth embodiment is completed.

According to the manufacturing method of the fifth embodiment of the present invention, similar effects to those of the manufacturing method of the fourth embodiment can be obtained. Furthermore, the light-emitting element, the light-receiving element, and the control element for controlling the light-emitting element and the light-receiving element are formed on the transparent substrate, and hence the number of processes is reduced, enabling further reductions in cost and thickness.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Applications No. 2004-288904 and No. 2005-234532 which are hereby incorporated by reference.

What is claimed is:

1. A manufacturing method for a semiconductor device, comprising:
    preparing a substrate having a first face and a second face opposing said first face, for transmitting light through said first face and said second face;
    providing a wiring layer having a first region and a second region adjacent to said first region on said first face of said substrate;
    providing a bump electrode on said first region of said wiring layer;
    providing a semiconductor chip having a third face such that said third face is connected to said bump electrode;
    providing a columnar electrode having a fourth face and a fifth face opposing said fourth face such that said fourth face contacts said second region of said wiring layer;
    providing a first sealant covering said first face of said substrate such that said fifth face of said columnar electrode is exposed;
    providing an external connection terminal on said fifth face of said columnar electrode; and
    dividing said substrate and said first sealant into individual semiconductor devices through dicing,
    wherein said second face of said substrate comprises a third region and a fourth region surrounding said third region, and
    said manufacturing method further comprises
        providing a second sealant covering said fourth region, said substrate, and a side face of said first sealant; and
        providing a lens, an outside edge portion of which is fixed to said second sealant provided on said fourth region.

2. A manufacturing method for a semiconductor device, comprising:
    preparing a substrate having a first face and a second face opposing said first face, for transmitting light through said first face and said second face;
    providing a wiring layer having a first region and a second region adjacent to said first region on said first face of said substrate;
    providing a bump electrode on said first region of said wiring layer;
    providing a semiconductor chip having a third face such that said third face is connected to said bump electrode;
    providing a columnar electrode having a fourth face and a fifth face opposing said fourth face such that said fourth face contacts said second region of said wiring layer;
    providing a first sealant covering said first face of said substrate such that said fifth face of said columnar electrode is exposed;
    providing an external connection terminal on said fifth face of said columnar electrode; and
    dividing said substrate and said first sealant into individual semiconductor devices through dicing,
    wherein said second face of said substrate comprises a third region and a fourth region surrounding said third region, and
    said manufacturing method further comprises
        removing a part of said third region and said fourth region of said second face such that said third region protrudes in a direction which increases the distance between said first face and said second face to form a lens.

* * * * *